United States Patent
Wang

(10) Patent No.: US 7,405,121 B2
(45) Date of Patent: Jul. 29, 2008

(54) SEMICONDUCTOR DEVICE WITH CAPACITORS AND ITS MANUFACTURE METHOD

(75) Inventor: Wensheng Wang, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/976,115

(22) Filed: Oct. 22, 2007

(65) Prior Publication Data

US 2008/0057641 A1 Mar. 6, 2008

Related U.S. Application Data

(62) Division of application No. 11/589,758, filed on Oct. 31, 2006, now Pat. No. 7,297,999.

(30) Foreign Application Priority Data

Jun. 29, 2006 (JP) .............................. 2006-179680

(51) Int. Cl.
*H01L 21/8242* (2006.01)
(52) U.S. Cl. ........................ 438/253; 438/240; 438/396; 257/E21.648
(58) Field of Classification Search ................. 438/239, 438/240, 253, 254, 255, 396, 397, 398, E21.648
See application file for complete search history.

(56) References Cited

U.S. PATENT DOCUMENTS 6,831,323 B2 12/2004 Ito et al.
7,221,015 B2 * 5/2007 Ando et al. .................. 257/306

FOREIGN PATENT DOCUMENTS

| JP | 11-168174 A | 6/1999 |
| JP | 2000-91511 A | 3/2000 |
| JP | 2002-151656 A | 5/2002 |
| JP | 2004-47633 A | 2/2004 |

* cited by examiner

*Primary Examiner*—Hoai v Pham
(74) *Attorney, Agent, or Firm*—Westerman, Hattori, Daniels & Adrian, LLP

(57) ABSTRACT

An interlayer insulating film (22) is formed on a semiconductor substrate. A conductive plug (25) is embedded in a via hole formed through the interlayer insulating film. An oxygen barrier conductive film (33) is formed on the interlayer insulating film and being inclusive of an area of the conductive plug as viewed in plan. A capacitor (35) laminating a lower electrode, a dielectric film and an upper electrode in this order is formed on the oxygen barrier film. An intermediate layer (34) is disposed at an interface between the oxygen barrier film and the lower electrode. The intermediate layer is made of alloy which contains at least one constituent element of the oxygen barrier film and at least one constituent element of the lower electrode.

6 Claims, 16 Drawing Sheets

SEMICONDUCTOR DEVICE WITH CAPACITORS AND ITS MANUFACTURE METHOD

CROSS REFERENCE TO RELATED APPLICATION

This application is a divisional of application Ser. No. 11/589,758, filed Oct. 31, 2006 now U.S. Pat. No. 7,297,999, which is based on and claims priority of Japanese Patent Application No. 2006-179680 filed on Jun. 29, 2006, the entire contents of which are incorporated herein by reference.

BACKGROUND OF THE INVENTION

A) Field of the Invention

The present invention relates to a semiconductor device having capacitors and its manufacture method, and more particularly to a semiconductor device having capacitors disposed on conductive plugs formed in an interlayer insulating film and its manufacture method.

B) Description of the Related Art

A tendency of high-speed processing or storing a large amount of data has increased recently, with development of digital technologies. From this reason, semiconductor devices used in electronic apparatus are required to have high integration and high performance.

In order to realize high integration of a semiconductor memory device, e.g., a DRAM, instead of using conventional silicon oxide or silicon nitride, a variety of studies have been made on technologies of using ferroelectric material or high dielectric constant material as the material of a dielectric film of a capacitor constituting DRAM.

Vigorous studies have been made also on technologies of using a ferroelectric film having spontaneous polarization as a capacitor dielectric film, in order to realize a nonvolatile RAM capable of reading and writing data at low voltage and at high speed. The semiconductor storage device of this type is called a ferroelectric random access memory (FeRAM).

A ferroelectric memory stores data by utilizing hysteresis characteristics of ferroelectric substance. A ferroelectric memory has a ferroelectric capacitor which is constituted of a ferroelectric film and a pair of electrodes sandwiching the ferroelectric film. The ferroelectric film generates polarization corresponding to a voltage applied across the electrodes, and spontaneous polarization is left even the applied voltage is removed. As the polarity of an applied voltage is reversed, the polarity of spontaneous polarization is also reversed. Data can be stored by relating two polarities of spontaneous polarization to data "0" and "1", respectively. Data can be read by detecting the polarity of spontaneous polarization. As compared to a flash memory, a ferroelectric memory can operate at a lower voltage and can write data at higher speed and with a smaller electric power.

A ferroelectric film constituting a capacitor of a ferroelectric memory is made of lead zirconate titanate (PZT), La-doped PZT (PLZT), PZT-based material finely doped with Ca, Sr or Si, Bi layer structure compound such as $SrBi_2Ta_2O_9$ (SBT, Y1) and $SrBi_2(Ta, Nb)_2O_9$ (SBTN, YZ) or the like. A ferroelectric film is formed by a sol-gel method, sputtering, metal organic chemical vapor deposition (MOCVD) or the like.

Generally, by using these film forming methods, a ferroelectric film in an amorphous phase or in a microcrystal phase is formed on a lower electrode. The crystalline structure is transformed into a perovskite structure or a bismuth layer structure by succeeding heat treatment. It is necessary to use, as the electrode material of a capacitor, material hard to be oxidized or material capable of retaining conductivity even if it is oxidized. Platinum group metal such as platinum (Pt) or iridium (Ir), and its oxide such as iridium oxide ($IrO_x$) are generally and widely used as the electrode material. Aluminum (Al) is generally used as a wiring material just like general semiconductor devices.

A ferroelectric memory is required to have higher integration and higher performance just like other semiconductor devices, so a cell area is required to be reduced further in the near future. In order to reduce a cell area, it is effective to adopt a stack structure instead of a planar structure. The "stack structure" is a structure that a capacitor is disposed just above a conductive plug (contact plug) formed on the drain of a transistor constituting a memory cell. In a ferroelectric memory of a conventional stack structure, a capacitor has a structure that a barrier metal film, a lower electrode, a ferroelectric film and an upper electrode are laminated in this order just above a conductive plug made of tungsten (W) or the like. The barrier metal film has a role of preventing oxidation of the conductive plug. Since material is selected often which provides both the function of a barrier material film and the function of a lower electrode, it is difficult to definitely distinguish between the barrier metal film and lower electrode. Generally, the barrier metal film and lower electrode are made of a combination of two or more films selected from a group consisting of a TiN film, a TiAlN film, an Ir film, an $IrO_2$ film, a Pt film and a SRO ($SrRuO_3$) film.

It is important to control orientation of a ferroelectric film so as to be oriented uniformly to manufacture a ferroelectric memory having good electric characteristics and high product yield. Orientation of the ferroelectric film is influenced greatly by orientation of a lower electrode. Namely, by controlling orientation of the lower electrode so as to be oriented uniformly, orientation of the ferroelectric film can be made uniform. Therefore, in order to manufacture a ferroelectric memory having good electric characteristics and high product yield, it is important to control orientation of the lower electrode so as to be oriented uniformly.

JP-A-2000-91511 discloses a method of executing rapid thermal annealing of a lower electrode in inert gas in a temperature range between about 400° C. and 900° C. after the lower electrode is formed and before a ferroelectric film is deposited, in order to maximize spontaneous polarization of a ferroelectric capacitor.

JP-A-HEI 11-168174 discloses a method of executing heat treatment in a temperature range between 200° C. and 300° C. or at a higher temperature after a lower electrode made of Ir is formed, in order to make residual polarization characteristics of a ferroelectric film uniform over the whole substrate surface and to prevent cracks from being generated in the ferroelectric film.

JP-A-2002-151656 discloses a method of executing heat treatment at a temperature of 550° C. after a lower electrode having a two-layer structure of $IrO_x$ and Ir is formed and before a PZT film is formed, in order to prevent deterioration of the electric characteristics of the ferroelectric film made of PZT.

The methods disclosed in JP-A-2004-47633 will be described below. After a Ru film is formed which is used as a lower electrode of a ferroelectric capacitor, preliminary heat treatment is executed at 350° C. to 500° C. Thereafter, after a PZT film and the like are formed, heat treatment is executed at about 600° C. to 700° C. for crystallization. If the preliminary heat treatment is not executed, crystals of the Ru film grow abruptly during crystallization heat treatment and the Ru film has crystal grains irregular in size. If the preliminary heat treatment is executed, abrupt crystal growth can be suppressed during crystallization heat treatment and the crystal structure having grains equal in size can be maintained.

SUMMARY OF THE INVENTION

A ferroelectric capacitor is disposed on a conductive plug in a via hole formed through an interlayer insulating film under the ferroelectric capacitor. The lower electrode of the capacitor is electrically connected to the conductive plug. When a capacitor ferroelectric film of oxide is formed, an oxygen barrier film of TiAlN or the like is disposed in some cases under the lower electrode in order to prevent oxidation of the conductive plug. In this case, while films from the upper electrode to the oxygen barrier film of the capacitor are patterned, a phenomenon (capacitor stripping phenomenon) is observed in which the capacitor is stripped or peeled off. The present inventor has found from various evaluation experiments that peel-off is likely to occur at the interface between the oxygen barrier film and the lower electrode.

An object of this invention is to provide a semiconductor device capable of improving adhesion at the interface between an oxygen barrier film and lower electrode and preventing a capacitor stripping phenomenon, and its manufacture method.

According to one aspect of the present invention, there is provided a semiconductor device comprising:

an interlayer insulating film formed over a semiconductor substrate;

a conductive plug filling a via hole formed through the interlayer insulating film;

a conductive oxygen barrier film formed over the interlayer insulating film and including thereinside the conductive plug as viewed in plan;

a capacitor formed over the oxygen barrier film and comprising a lower electrode, a dielectric film and an upper electrode stacking in this order; and an intermediate layer disposed at an interface between the oxygen barrier film and the lower electrode and made of alloy which contains at least one constituent element of the oxygen barrier film and at least one constituent element of the lower electrode.

According to another aspect of the present invention, there is provided a method of manufacturing a semiconductor device comprising steps of:

(a) forming an interlayer insulating film over a semiconductor substrate;

(b) forming a via hole through the interlayer insulating film and filling the via hole with a conductive plug;

(c) forming an oxygen barrier film over an upper surface of the conductive plug and over an upper surface of the interlayer insulating film;

(d) depositing a lower electrode layer on the oxygen barrier film;

(e) executing heat treatment to form an intermediate film at an interface between the oxygen barrier film and the lower electrode layer, the intermediate film being made of alloy which contains at least one constituent element of the oxygen barrier film and at least one constituent element of the lower electrode layer;

(f) sequentially forming a dielectric layer and an upper electrode layer on the lower electrode layer; and (g) patterning each of layers between the oxygen barrier film and the upper electrode layer to leave the oxygen barrier film in an area where the conductive plug is disposed.

DESCRIPTION OF THE PREFERRED EMBODIMENTS

Figure 1A:
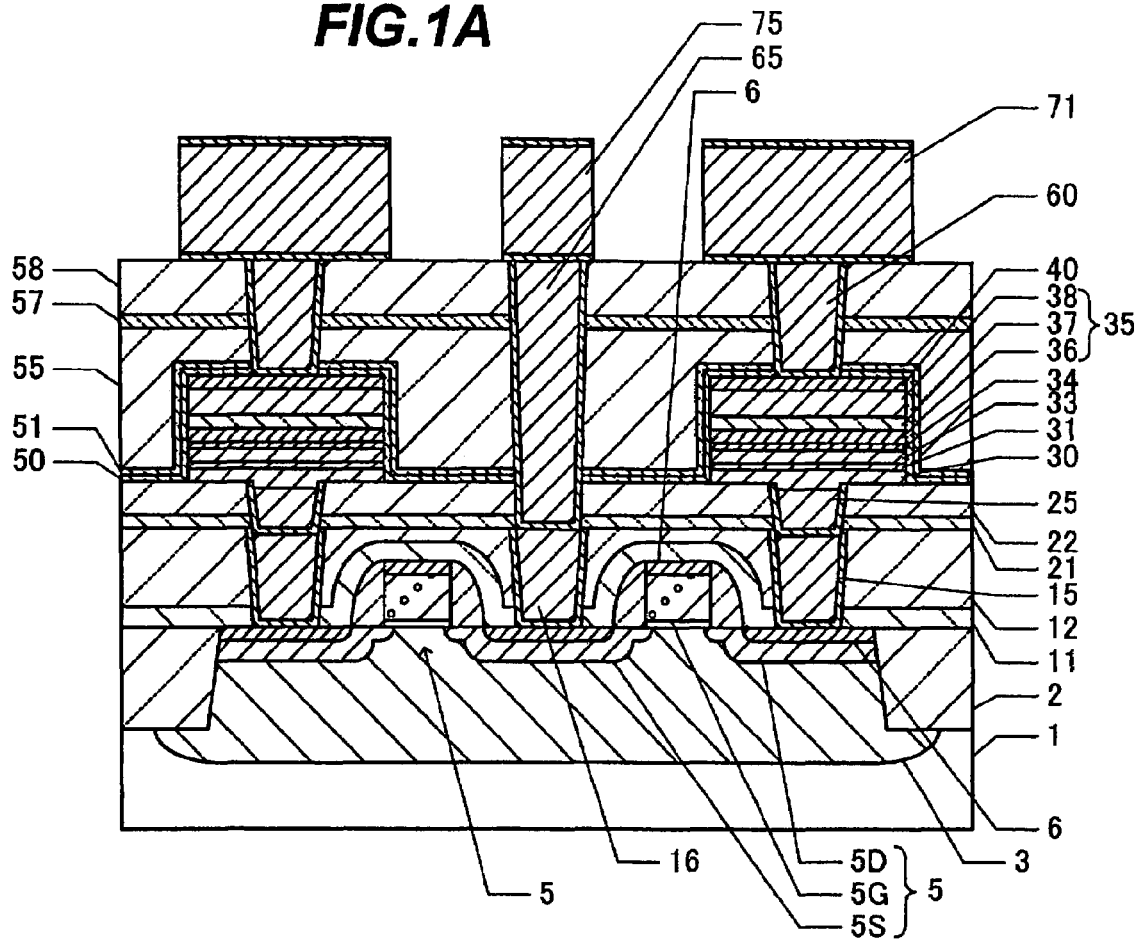
FIG. 1A is a cross sectional view of a semiconductor device according to a first embodiment of the present invention.
Figure 1B:
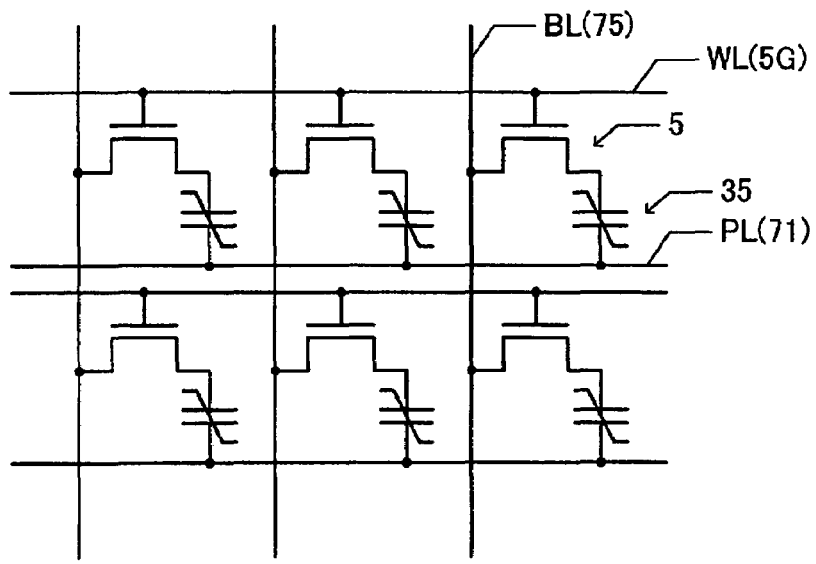
FIG. 1B is an equivalent circuit diagram of the semiconductor device.

FIG. 1A is a cross sectional view of a semiconductor device according to the first embodiment, and FIG. 1B is an equivalent circuit diagram of the semiconductor device.

As shown in FIG. 1B, one memory cell is disposed at each of cross points between a plurality of word lines WL extending in a lateral direction in FIG. 1B and a plurality of bit lines BL extending in a longitudinal direction. Each memory cell is constituted of a MOS transistor 5 and a ferroelectric capacitor 35. A plate line PL is disposed in correspondence with each word line WL.

A gate electrode of the MOS transistor 5 is connected to the word line WL, a source is connected to the bit line BL, and a drain is connected to one electrode of the ferroelectric capacitor 35. The other electrode of the ferroelectric capacitor 35 is connected to the plate line PL. As the MOS transistor 5 is made conductive by applying an electric signal to the word like WL, a voltage corresponding to a potential difference between the bit line BL and plate line PL is applied to the ferroelectric capacitor 35 and data is written. As the MOS transistor 5 is made conductive, an electric signal corresponding to a polarity of spontaneous polarization of the ferroelectric capacitor 35 is output to the bit line BL and data is read.

FIG. 1A is a cross sectional view showing a region of two memory cells. An isolation insulating film 2 is formed in the surface layer of a semiconductor substrate 1 made of silicon, to define active regions surrounded by the isolation insulating film 2. The active region is disposed in a p-type well 3. Two MOS transistors 5 are formed in the active region.

The structure of the memory cell including one MOS transistor 5 is the same as that of the memory cell including the other MOS transistor 5. In the following, description will be made on the structure of the memory cell including one MOS transistor 5.

A channel region is defined between a source region 5S and a drain region 5D of the MOS transistor 5, and a gate electrode 5G is disposed above the channel region via a gate insulating film. The source region 5S is shared by two MOS transistors 5. Sidewall spacers are formed on sidewalls of the gate electrode 5G. A metal silicide film 6 is formed on upper surfaces of the source region 5S, drain region 5D and gate electrode 5G.

A cover insulating film 11 is formed on the semiconductor substrate 1, covering the MOS transistor 5. The cover insulating film 11 is made of silicon oxynitride (SiON) and has a thickness of 200 nm. An interlayer insulating film 12 of silicon oxide ($SiO_2$) is formed on the cover insulating film 11. The surface of the interlayer insulating film 12 is planarized and a thickness of the interlayer insulating film 12 is 700 nm in a region where the underlying surface is flat.

Via holes reaching the metal silicide film 6 on the source region 5S and the metal silicide film 6 on the drain region 5D are formed through the interlayer insulating film 12 and cover insulating film 11. A diameter of each of the via holes is 0.25 µm. The inner surface of each of the via holes is covered with a glue film, and the via holes are filled with conductive plugs 15 and 16 made of tungsten (W). One conductive plug 15 is connected to the drain region 5D and the other conductive plug 16 is connected to the source region 5S. The glue film has a two-layer structure laminating a Ti film of 30 nm in thickness and a TiN film of 20 nm in thickness in this order.

An oxidation preventive film 21 of SiON having a thickness of 130 nm is formed on the interlayer insulating film 12. An interlayer insulating film 22 of $SiO_2$ having a thickness of 300 nm is formed on the oxidation preventive film 21. The oxidation preventive film 21 may be made of silicon nitride (SiN) or aluminum (AlO) instead of SiON.

A via hole is formed through the interlayer insulating film 22 and oxidation preventive film 21, reaching an upper surface of the underlying conductive plug 15. A diameter of the via hole is 0.25 µm. The inner surface of the via hole is covered with a glue film, and the via hole is filled with a conductive plug 25 of W. The glue film has a two-layer structure laminating a Ti film of 30 nm in thickness and a TiN film of 20 nm in thickness in this order. The conductive plug 25 is connected via the underlying conductive plug 15 to the drain region 5D.

A ferroelectric capacitor 35 is disposed on the conductive plug 25 and interlayer insulating film 22 so as to include thereinside the conductive plug 25 as viewed in plan. The ferroelectric capacitor 35 has a structure laminating a lower electrode 36, a dielectric film 37 and an upper electrode 38 in this order. Between the upper surfaces of both of the conductive plug 25 and interlayer insulating film 22 and the ferroelectric capacitor 35, four layers are laminated including a base conductive film 30, a crystallinity improving film 31, an oxygen barrier film 33 and an intermediate layer 34 sequentially laminated in this order from the substrate side. A hydrogen barrier film 40 is disposed on the ferroelectric capacitor 35.

The base conductive film 30 is made of TiN oriented in (111) and has a thickness of 100 nm. The base conductive film 30 may be made of W, Si or Cu oriented in (111) instead of TiN. The thickness may be in a range between 100 nm and 300 nm. The upper surface of the conductive plug 25 is made slightly lower than the upper surface of the surrounding interlayer insulating film 22 to form a recess. This recess is filled with the base conductive film 30 and the upper surface of the base conductive film 30 is planarized.

The crystallinity improving film 31 is made of TiN oriented in (111) and has a thickness of 20 nm. Instead of TiN, the crystallinity improving film 31 may be made of Ti, Pt, Ir, Re, Ru, Pd or Os or alloy of these metals. If conductive material constituting the crystallinity improving film 31 has a face-centered cubic structure, this material is oriented in (111), whereas if it has a hexagonal closest packed structure, it is oriented in (002).

The oxygen barrier film 33 is made of TiAlN, has a thickness of 100 nm, and prevents diffusion of oxygen to prevent oxidation of the underlying conductive plug 25. The oxygen barrier film 33 is oriented in (111) by inheriting orientation of the underlying crystallinity improving film 31.

The lower electrode 36 is made of Ir and has a thickness of 100 nm. The lower electrode 36 is oriented in (111) because it inherits the orientation of the oxygen barrier film 33. Instead of Ir, the lower electrode 36 may be made of platinum group metal such as Pt or conductive oxide such as PtO, IrO and $SrRuO_3$. The lower electrode 36 may consist of a plurality of films made of these conductive materials.

The intermediate layer 34 is made of alloy which contains at least one constituent element of the oxygen barrier film 33 and at least one constituent element of the lower electrode 36. If the lower electrode 36 is made of Ir or IrO, the intermediate layer 34 is made of IrAl alloy. If the lower electrode 36 is made of Pt or PtO, the intermediate layer 34 is made of PtAl alloy. If the lower electrode 36 is made of $SrRuO_3$, the intermediate layer 34 is made of RuAl alloy.

The dielectric film 37 is made of ferroelectric substance having a perovskite structure or bismuth layer structure and has a thickness in a range between 100 nm and 130 nm. Usable ferroelectric substance includes lead zirconate titanate (PZT), La-doped PZT (PLZT), PZT-based material finely doped with Ca, Sr or Si, $SrBi_2Ta_2O_9$ (SBT, Y1), $SrBi_2(Ta, Nb)_2O_9$ (SBTN, YZ), $(Bi, La)_4Ti_3O_{12}$ (BLT) and the like.

The upper electrode 38 is made of IrO. More particularly, the upper electrode 38 is made of a lower layer portion having an oxygen composition ratio of 1 or higher and lower than 2 and an upper layer portion having an oxygen composition ratio higher than that of the lower layer portion and near 2 which is a stoichiometric composition ratio. A thickness of the lower layer portion is 50 nm and a thickness of the higher layer portion is in a range between 100 nm and 300 nm.

Instead of IrO, the upper electrode 38 may be made of Ir, Ru, Rh, Re, Os or Pd, oxide of these materials, or conductive oxide such as $SrRuO_3$. The upper electrode 38 may consist of a plurality of films made of these conductive materials.

The hydrogen barrier film 40 is made of Ir and has a thickness of 100 nm. Instead of Ir, the hydrogen barrier film 40 may be made of Pt, $SrRuO_3$ or the like.

A first protective film 50 is formed covering the surface of the lamination structure consisting of the base conductive film 30, the hydrogen barrier film 40 and films therebetween, and the surface of the interlayer insulating film 22. A second protective film 51 is formed on the first protective film 50. The first and second protective films 50 and 51 are both made of AlO, and a thickness of each protective film is about 20 nm.

An interlayer insulating film 55 of $SiO_2$ is formed on the second protective film 52. The upper surface of the interlayer insulating film 55 is planarized. A barrier film 57 of AlO is formed on the planarized interlayer insulating film 55. A thickness of the barrier film 57 is in a range between 20 nm and 100 nm.

On the barrier film 57, an interlayer insulating film 58 is formed which is made of $SiO_2$ and has a thickness of 300 nm to 500 nm. Instead of $SiO_2$, the interlayer insulating film 58 may be made of SiON or SiN.

A via hole is formed through five layers of the first protective film 50 to interlayer insulating film 58, reaching the hydrogen barrier film 40 on the capacitor 35. The inner surface of the via hole is covered with a glue film, and the via hole is filled with a conductive plug 60 of W. A via hole is formed through seven layers of the oxidation preventive film 21 to interlayer insulating film 58, reaching the conductive plug 16. The inner surface of the via hole is covered with a glue film, and the via hole is filled with a conductive plug 65 of W. These glue films may be made of a single TiN film or two layers of a Ti film and a TiN film.

Wirings 71 and 75 are formed on the interlayer insulating film 58. The wirings 71 and 75 each have a five-layer structure of a Ti film having a thickness of 60 nm, a TiN film having a thickness of 30 nm, an AlCu alloy film having a thickness of 360 nm, a Ti film having a thickness of 5 nm and a TiN film having a thickness of 70 nm laminated in this order.

The wiring 71 is connected to the upper electrode 38 of the capacitor 35 via the underlying conductive plug 60, and corresponds to the plate line PL shown in FIG. 1B. The other wiring 75 is connected to the source region 5S of the MOS transistor 5 via the underlying conductive plugs 65 and 16, and corresponds to the bit line BL shown in FIG. 1B. The gate electrode 5G is also used as the word line WL shown in FIG. 1B.

Next, with reference to FIGS. 2A to 2Z, description will be made on the manufacture method for the semiconductor device of the first embodiment.

Figure 2A:
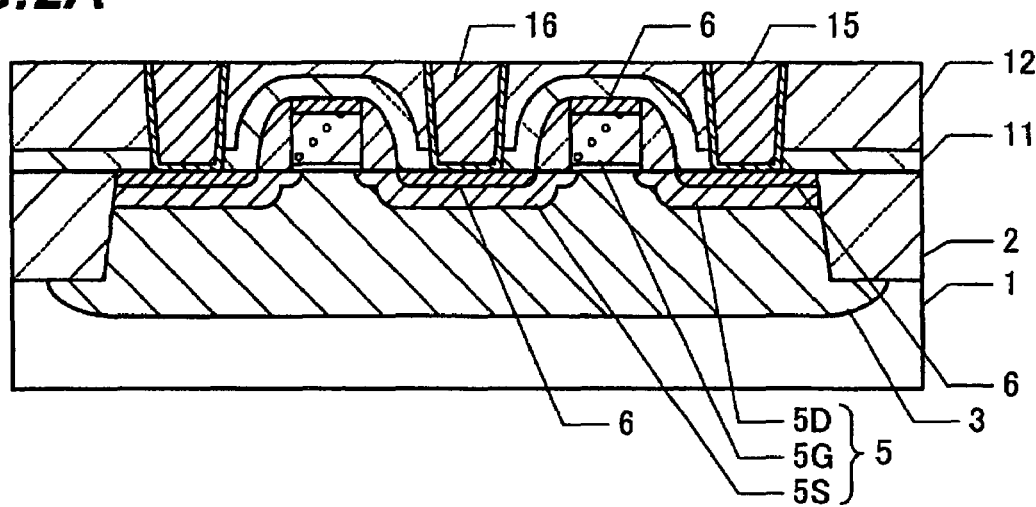
FIGS. 2A to 2Z are cross sectional views of the semiconductor device of the first embodiment during manufacture.

As shown in FIG. 2A, an isolation insulating film 2 is formed in a surface layer of a substrate 1 made of n- or p-type silicon to define active regions. The isolation insulating film 2 is formed, for example, by a shallow trench isolation method (STI method), or it may be formed by a local oxidation of silicon method (LOCOS method). A p-type well 3 is formed by implanting p-type dopant ions in the surface layer of the active region.

Two MOS transistors 5 are formed in one active region. Brief description will be made hereunder on a method of forming the MOS transistor 5.

The surface of the active region is thermally oxidized to form a $SiO_2$ film to be used as a gate insulating film. A silicon film of amorphous silicon or polysilicon is formed on the substrate and patterned to form a gate electrode 5G. Two gate electrodes intersect with one active region generally in parallel as viewed in plan.

By using the gate electrode 5G as a mask, ions of n-type dopant are implanted to form extensions of a source region 5S and a drain region 5D. Sidewall spacers are formed on the sidewalls of the gate electrode 5G. By using the gate electrode 5G and sidewall spacers as a mask, ions of n-type dopant are implanted to form deep source and drain regions 5S and 5D. With these processes, the MOS transistor 5 is formed.

Next, a film of refractory metal such as cobalt (Co) is formed on the substrate by sputtering. Heat treatment is executed to react silicon and the refractory metal film and form a refractory metal silicide film 6 on the supper surfaces of the gate electrode 5G, source region 5S and drain region 5D. Thereafter, an unreacted refractory metal film is removed.

A cover insulating film 11 of SiON having a thickness of 200 nm is formed on the substrate by plasma CVD, covering the MOS transistors 5. An interlayer insulating film 12 of $SiO_2$ having a thickness of 1000 nm is formed on the cover insulating film 11. For example, the interlayer insulating film 12 is formed by plasma CVD using oxygen ($O_2$) and tetraethyl orthosilicate (TEOS). Thereafter, the surface of the interlayer insulating film 12 is planarized by chemical mechanical polishing (CMP). CMP is controlled so that a thickness of the planarized interlayer insulating film is about 700 nm in a region where the underlying surface is flat.

A via hole reaching the refractory metal silicide film 6 on the drain region 5D and via holes reaching the refractory metal silicide film 6 on the source regions 5S are formed through the interlayer insulating film 12 and cover insulating film 11. A diameter of each of the via holes is 0.25 μm, for example.

The inner surfaces of the via holes and the upper surface of the interlayer insulating film 12 are covered with two layers of a Ti layer having a thickness of 30 nm and a TiN layer having a thickness of 20 nm. On these layers, a W film is deposited until the via holes are filled completely. A thickness of the W film is 300 nm for example, unnecessary W film, TiN film and Ti film are removed by CMP to leave glue film consisting of the Ti film and the TiN film, and conductive plugs 15 and 16 of W in the via holes. The conductive plugs 15 and 16 are connected to the drain regions 5D and source region 5S, respectively.

Figure 2B:
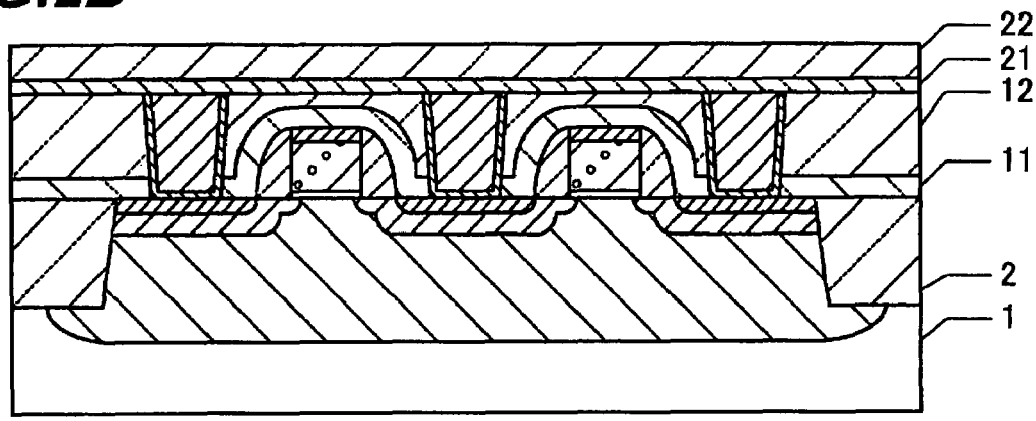

As shown in FIG. 2B, an oxidation preventive film 21 of SiON having a thickness of 130 nm is formed on the interlayer insulating film 12 by plasma CVD. Instead of SiON, the oxidation preventive film 21 of SiN or AlO may be formed. An interlayer insulating film 22 of $SiO_2$ having a thickness of 300 nm is formed on the oxidation preventive film 21 by plasma CVD using $O_2$ and TEOS.

Figure 2C:
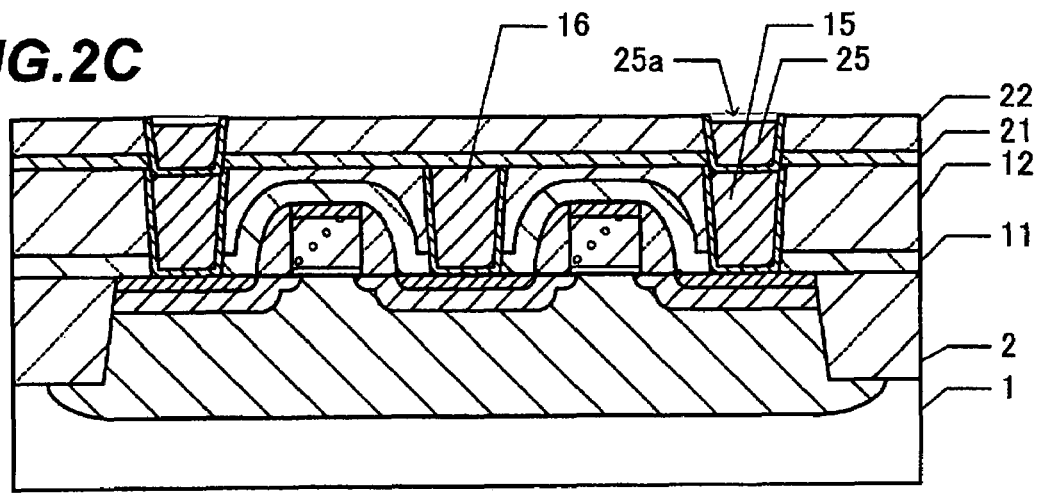

As shown in FIG. 2C, via holes are formed through the interlayer insulating film 22 and oxidation preventive film 21 to expose the underlying conductive plugs 15. The inner surface of the via hole is covered with a glue film and the via hole is filled with a conductive plug 25 of W. The conductive plug 25 and glue film are formed by the same method as that of forming the underlying conductive plug 15 and glue film.

CMP for removing an unnecessary W film and glue film is executed under the condition that a polishing rate of the W film and glue film is faster than a polishing rate of the interlayer insulating film 22. For example, SSW2000 manufactured by Cabot Microelectronics Corporation is used as slurry. Over-polishing is executed slightly so as not to leave the glue film and W film on the interlayer insulating film 22. Therefore, the upper surface of the conductive plug 25 becomes lower than the upper surface of the interlayer insulating film 22 closing around the conductive plug 25, and a recess 25a is formed. A depth of the recess 25a is 20 nm to 50 nm, typically about 50 nm for example.

After CMP, the upper surfaces of the interlayer insulating film 22 and conductive plug 25 are exposed to plasma of ammonium ($NH_3$). This plasma process is executed by using a diode parallel plate plasma cleaning apparatus under the following conditions for example:

Distance between substrate surface and opposing electrode: about 9 mm (350 mils);
Pressure: 266 Pa (2 Torr);
Substrate temperature: 400° C.;
$NH_3$ gas flow rate: 350 sccm;
RF power at 13.56 MHz supplied to substrate side electrode: 100 W;
RF power at 350 kHz supplied to opposing electrode: 55 W; and
Process time: 60 seconds.

Instead of $NH_3$ plasma, plasma which contains nitrogen element may be used, such as $N_2O$ plasma and $N_2$ plasma.

Processes up to the state shown in FIG. 2D will be described. First, a Ti film having a thickness of 100 nm is formed by DC sputtering on the surface subjected to the plasma process. For example, the sputtering conditions are as follows:

Distance between substrate and target: 60 mm;
Ar gas pressure: 0.15 Pa;
Substrate temperature: 150° C.;
DC power: 2.6 kW; and
Film forming time: 35 seconds.

Under these conditions, a Ti film is formed which has the hexagonal closest packed structure and is oriented in (002). If the substrate surface is processed by $NH_3$ plasma before the Ti film is formed, NH groups are bonded to oxygen atoms on the surface of the interlayer insulating film 22. As a result, Ti atoms supplied to the surface of the interlayer insulating film 22 become easy to move on the surface without being captured by oxygen atoms. Orientation of the Ti film can therefore be improved.

Next, rapid thermal annealing (RTA) is performed in a nitrogen atmosphere. For example, the conditions of RTA are as follows:

Annealing temperature: 600° C.; and
Process time: 60 seconds.

With this annealing, the Ti film is nitrided and a base conductive film 30 is formed which has a face-centered cubic structure and made of TiN oriented in (111). A thickness of the base conductive film 30 may be set in a range between 100 nm and 300 nm. At this stage, the surface of the base conductive film 30 has a recess above the conductive plug 25 by reflecting the recess 25a on the underlying surface. The surface of the base conductive film 30 is planarized by CMP. For example, SSW2000 manufactured by Cabot Microelectronics Corporation is used as slurry. A thickness of the base conductive film 30 after CMP is 50 nm to 100 nm, typically about 50 nm.

After CMP, the surface of the planarized base conductive film 30 is exposed to $NH_3$ plasma. Crystalline strains generated in a surface layer of the base conductive film 30 during CMP can be recovered. Nitrogen-element-containing plasma such as $N_2O$ plasma and $N_2$ plasma may be used instead of $NH_3$ plasma.

Processes up to the state shown in FIG. 2E will be described. A Ti film having a thickness of 20 nm is formed on the base conductive film 30 by sputtering. This Ti film has a hexagonal closest structure and is oriented in (002). Next, RTA is performed in a nitrogen atmosphere. For example, the conditions of RTA are as follows:

Annealing temperature: 650° C.; and
Process time: 60 seconds.

With this annealing, the Ti film is nitrided and a crystallinity improving film 31 is formed which has a face-centered cubic structure and made of TiN oriented in (111). Since the surface of the base conductive film 30 under the crystallinity improving film 31 is planarized, crystallinity of the crystallinity improving film 31 can be improved.

Figure 2D:
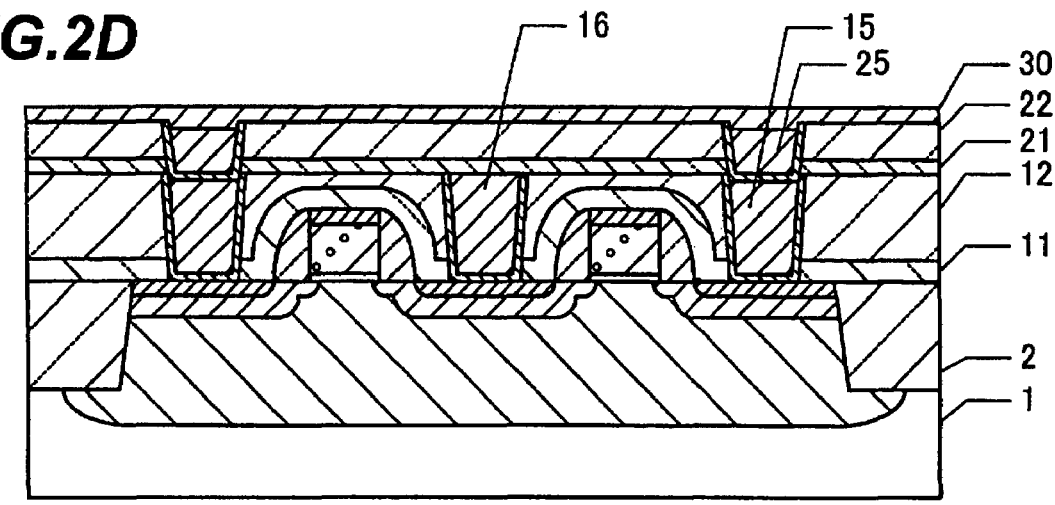
Figure 2E:
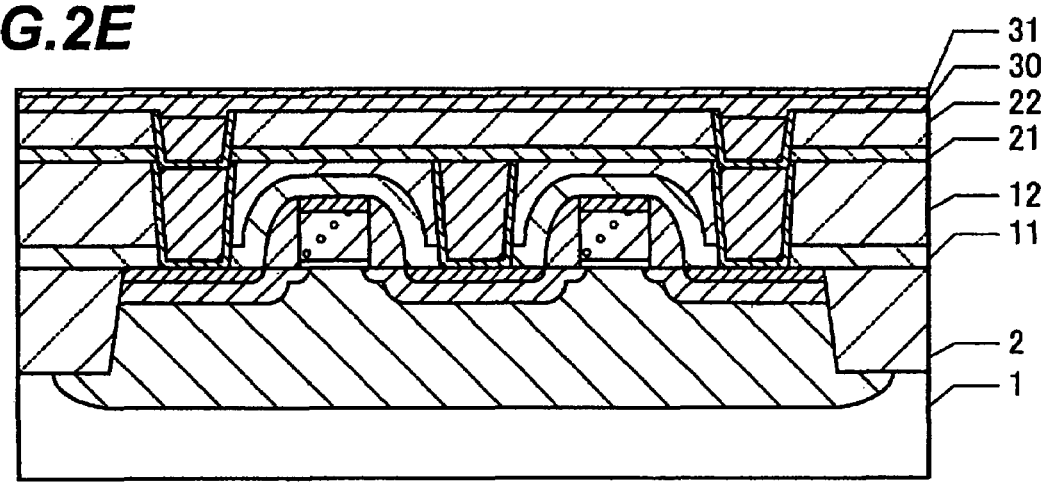
Figure 2F:
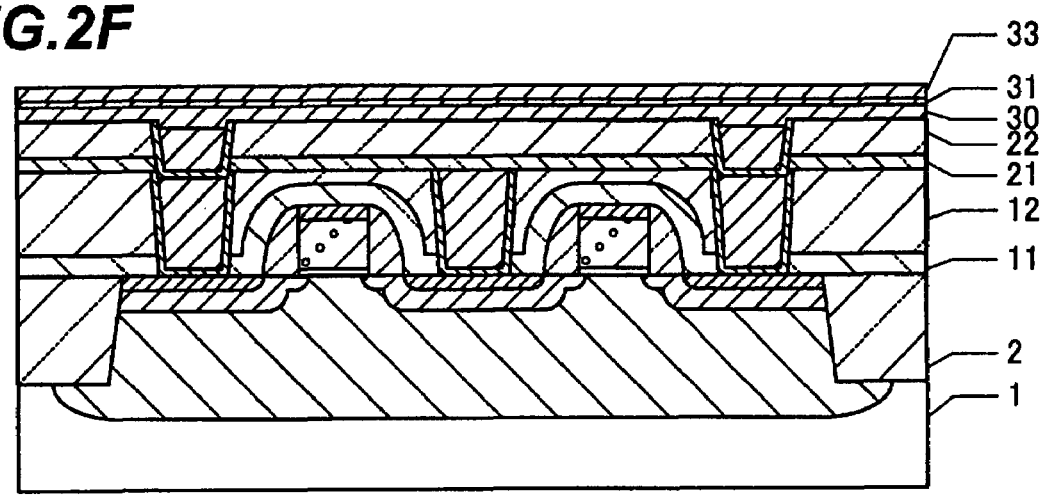

As shown in FIG. 2F, an oxygen barrier film 33 made of TiAlN having a thickness of 100 nm is formed on the crystallinity improving film 31 by reactive sputtering using a TiAl alloy target. For example, the sputtering conditions are as follows:

Ar gas flow rate: 40 sccm;
$N_2$ gas flow rate: 10 sccm;
Pressure: 253.3 Pa;
Substrate temperature: 400° C.; and
DC power: 1.0 kW.

Figure 2G:
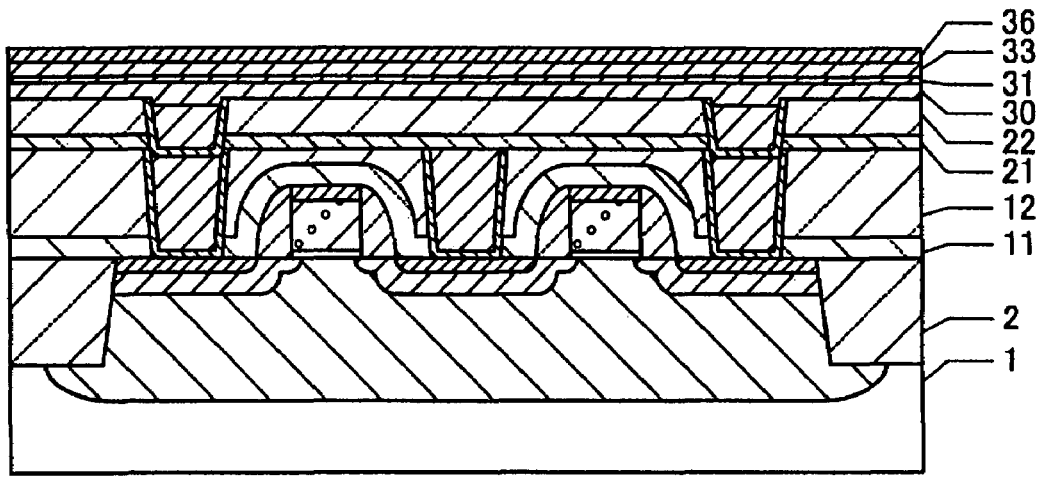

As shown in FIG. 2G, a lower electrode layer 36 made of Ir having a thickness of 100 nm is formed on the oxygen barrier film 33 by sputtering. The sputtering conditions are as follows:

Ar atmosphere pressure: 0.11 Pa;
Substrate temperature: 500° C.; and
DC power: 0.5 kW.

After the lower electrode layer 36 is formed, RTA is performed in an Ar atmosphere at a temperature higher than the temperature at which the lower electrode layer 36 is formed, and more particularly RTA is performed under the following conditions:

Temperature: 650° C.; and
Process time: 60 seconds.

Figure 2H:
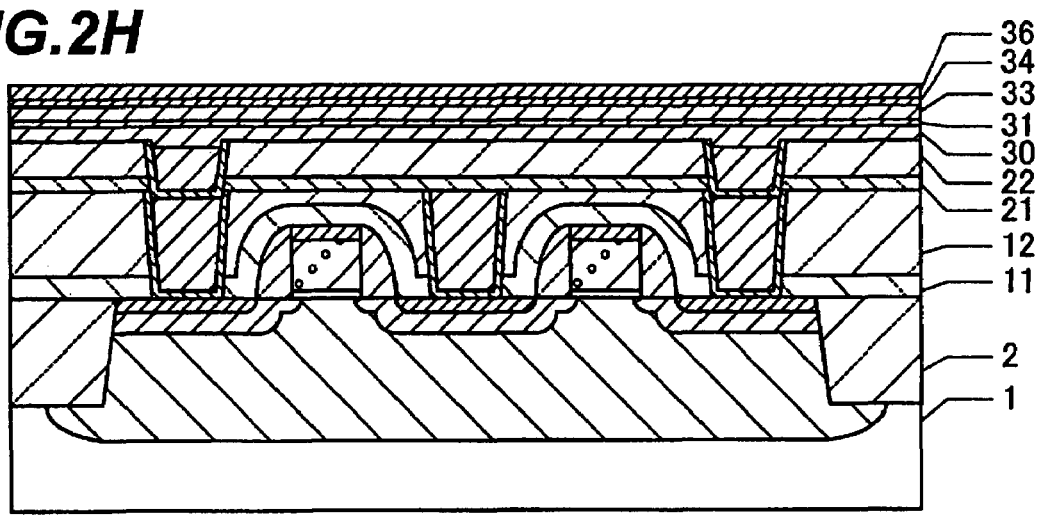

As shown in FIG. 2H, with this heat treatment, Al which is a constituent element of the oxygen barrier film 33 reacts with Ir which is a constituent element of the upper electrode layer 36, and an intermediate layer 34 of IrAl alloy is formed at the interface between the oxygen barrier film 33 and upper electrode layer 36. The intermediate layer 34 improves adhesion between the oxygen barrier film 33 and upper electrode layer 36. A temperature of this heat treatment is higher than the substrate temperature at which the lower electrode layer 36 is formed, and can heat the substrate whole surface generally uniformly. It is therefore possible to improve crystallinity of the lower electrode layer 36 and a variation in crystallinity along the substrate in-plane can be reduced. These advantageous effects will be later described more specifically with reference to FIGS. 3A to 4D.

This heat treatment may be performed in other inert gas atmospheres such as a $N_2$ gas atmosphere and a He gas atmosphere as well as in an Ar atmosphere.

Instead of Ir, the lower electrode layer 36 may be made of platinum group metal such as Pt or conductive oxide such as PtO, IrO and $SrRuO_3$. If the lower electrode 36 is made of IrO, the intermediate layer 34 is made of IrAl alloy. If the lower electrode 36 is made of Pt or PtO, the intermediate layer 34 is made of PtAl alloy. If the lower electrode 36 is made of $SrRuO_3$, the intermediate layer 34 is made of RuAl alloy.

Figure 2I:
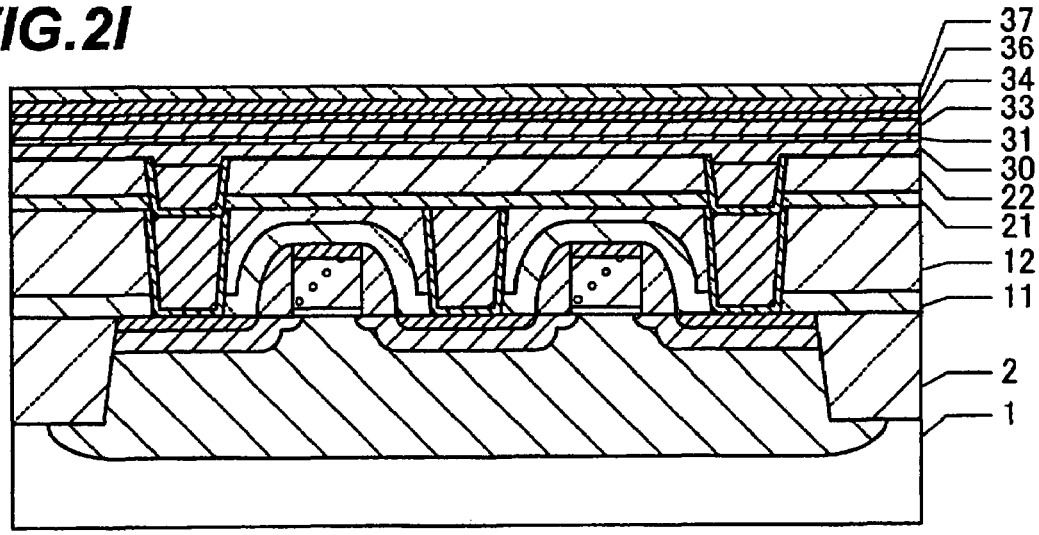

As shown in FIG. 2I, a dielectric film 37 of PZT is formed on the lower electrode layer 36 by metal organic chemical vapor deposition (MOCVD). Description will be made hereunder on a method of forming the dielectric film 37.

As Pb raw material, liquid raw material of $Pb(C_{11}H_{19}O_2)_2$ is used which is dissolved in tetrahydrofuran (THF) and has a concentration of 0.3 mol/l. As Zr raw material, liquid raw material of $Zr(C_9H_{15}O_2)_4$ is used which is dissolved in THF and has a concentration of 0.3 mol/l. As Ti raw material, liquid raw material of $Ti(C_3H_7O)_2(C_{11}H_{19}O_2)_2$ is used which is dissolved in THF and has a concentration of 0.3 mol/l. These liquid raw materials together with THF solvent are supplied to a vaporizer of a MOCVD system. Flow rates of THF solvent, Pb raw material, Zr raw material and Ti raw material are set to 0.474 ml/min, 0.326 ml/min, 0.200 ml/min and 0.200 ml/min, respectively.

The substrate on which the dielectric film 37 is to be formed is mounted in a chamber of the MOCVD system. A pressure in the chamber is set to 665 Pa and a substrate temperature is set to 620° C. Vaporized raw material gasses are introduced into the chamber and film formation is performed for 620 seconds to thereby form a PZT film having a thickness of 100 nm.

Next, a PZT film is formed to a thickness of 1 nm to 30 nm, typically 20 nm by sputtering. By disposing the PZT film formed by sputtering, leak current can be reduced.

Figure 2J:
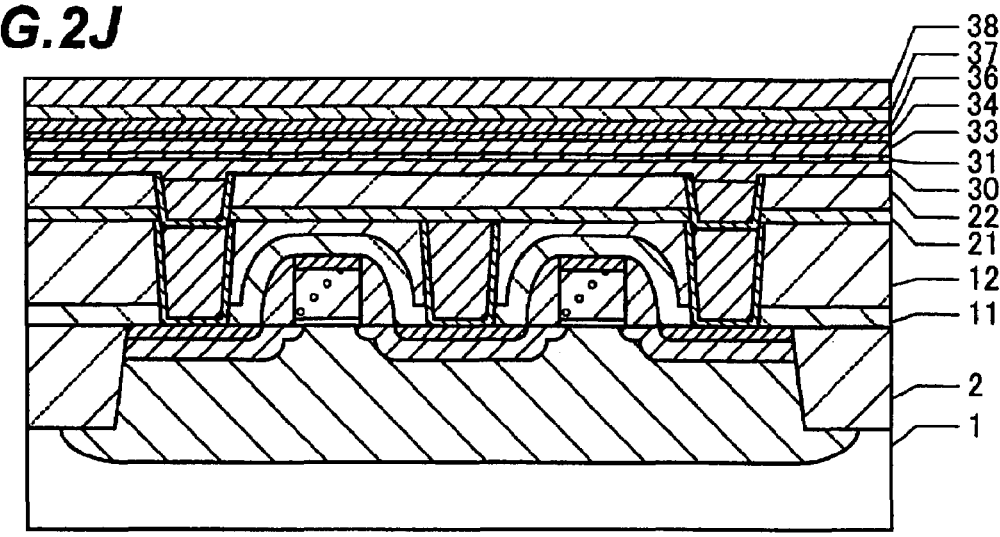

As shown in FIG. 2J, an upper electrode layer 38 is formed on the dielectric film 37. Description will be made hereunder on a method of forming the upper electrode layer 38. A lower layer portion of $IrO_x$ having a thickness of 50 nm is first formed by sputtering. The oxygen composition ratio x is set to 1 or larger and smaller than 2. For example, the sputtering conditions are as follows:

Substrate temperature: 300° C.;
Ar gas flow rate: 140 sccm;
$O_2$ gas flow rate: 60 sccm;
Pressure: 0.9 Pa: and
DC power: 1 to 2 kW.

After the upper electrode layer 38 is formed, RTA is performed under the following conditions:

Process temperature: 725° C.;
Atmosphere: $O_2$ flow rate of 20 sccm+Ar flow rate of 2000 sccm; and
Process time: 60 seconds.

With this heat treatment, crystallinity of the dielectric film 37 can be improved. Further, damages, which are generated while the dielectric film 37 is exposed to plasma when the lower layer portion of the upper electrode layer 38 is formed, can be recovered and oxygen loss can be compensated.

Thereafter, an upper layer portion of $IrO_y$ having a thickness of 100 nm to 300 nm is formed on the lower layer portion by sputtering. The oxygen composition ratio y is larger than the oxygen composition ratio x of the lower layer portion and is approximately 2 which is a stoichiometric composition ratio. For example, the sputtering conditions are as follows:

Substrate temperature: 20° C.;
Ar gas flow rate: 100 sccm;
$O_2$ gas flow rate: 100 sccm;
Pressure: 0.6 Pa; and
DC power: 1 kW.

By performing film formation, for example, for 79 seconds under the above-described conditions, an $IrO_y$ film having a thickness of 200 nm can be formed.

Figure 2K:
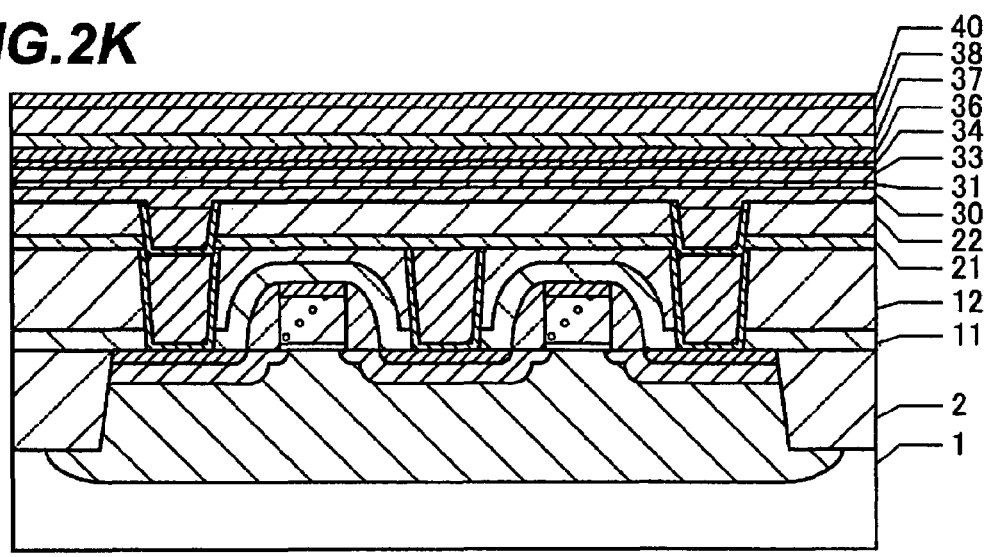

As shown in FIG. 2K, a hydrogen barrier film 40 of Ir having a thickness of 100 nm is formed on the upper electrode layer 38 by sputtering. For example, the sputtering conditions are as follows:

Ar gas flow rate: 199 sccm;
Pressure: 1 Pa;
Substrate temperature: 350° C.; and
DC power: 1.0 kW.

The hydrogen barrier film 40 may be made of Pt, $SrRuO_3$ or the like instead of Ir.

After the hydrogen barrier film 40 is formed, the bottom surface of the semiconductor substrate 1 is cleaned to remove a PZT film attached to the bottom surface.

Figure 2L:
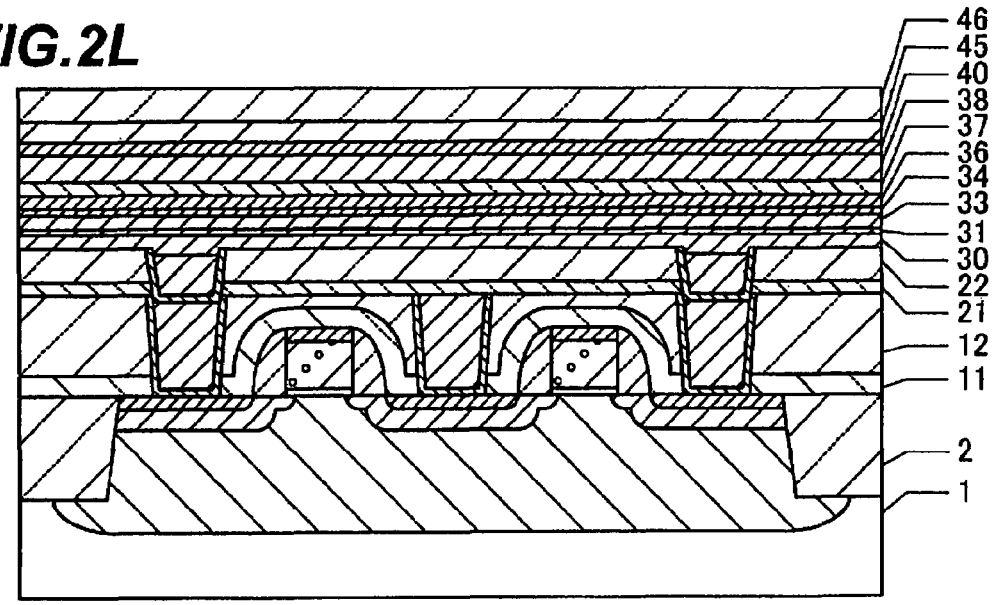

As shown in FIG. 2L, a first hard mask 45 of TiN and a second hard mask 46 of $SiO_2$ are formed on the hydrogen barrier film 40. The first hard mask 45 is formed, for example, by sputtering. The second hard mask 46 is formed, for example, by CVD using $O_2$ and TEOS.

Figure 2M:
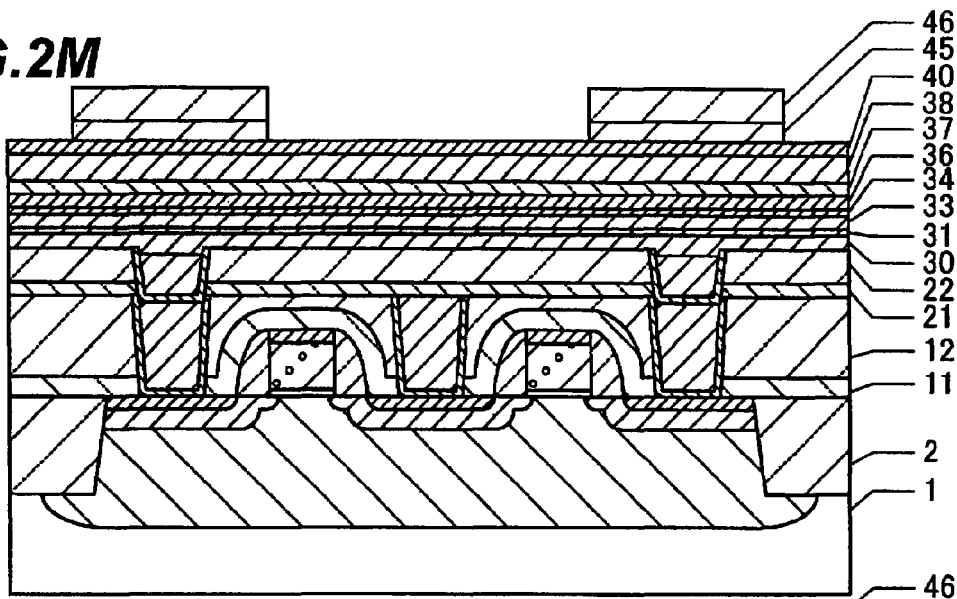

As shown in FIG. 2M, the second hard mask 46 is patterned in a plan shape of the ferroelectric capacitor to be formed. Next, by using the patterned second hard mask 46 as an etching mask, the first hard mask 45 is etched.

Figure 2N:
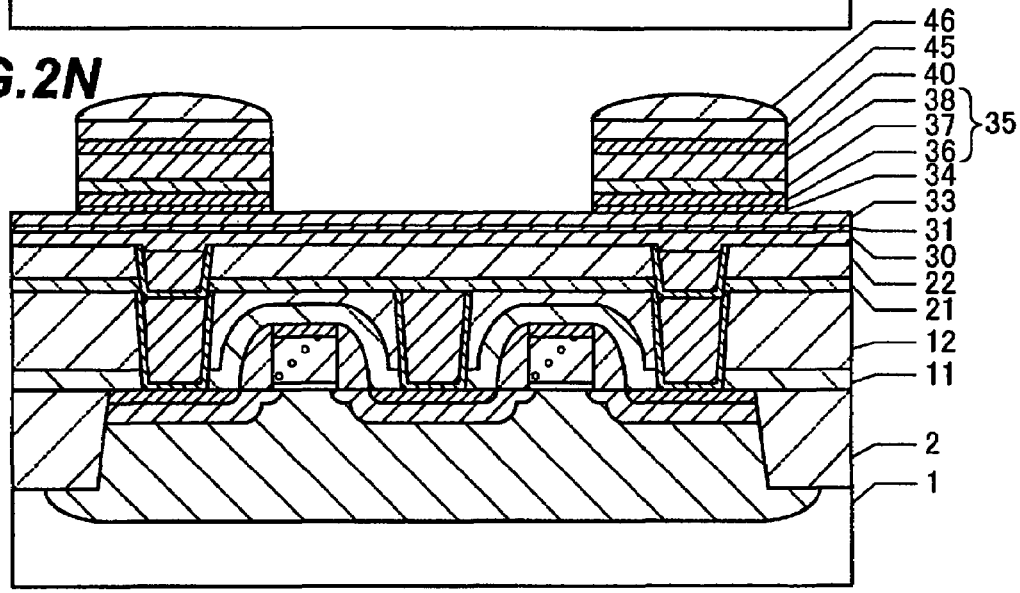

As shown in FIG. 2N, the first barrier film 40, upper electrode layer 38, dielectric film 37, lower electrode layer 36 and intermediate layer 34 are etched by using the second hard mask 46 and first hard mask 45 as an etching mask. This etching is performed, for example, by plasma etching using mixture gas of HBr, $O_2$, Ar and $C_4F_8$. The patterned lower electrode 36, dielectric film 37 and upper electrode 38 constitute a ferroelectric capacitor 35. During this etching, a surface layer of the second hard mask 46 is also etched.

Figure 2O:
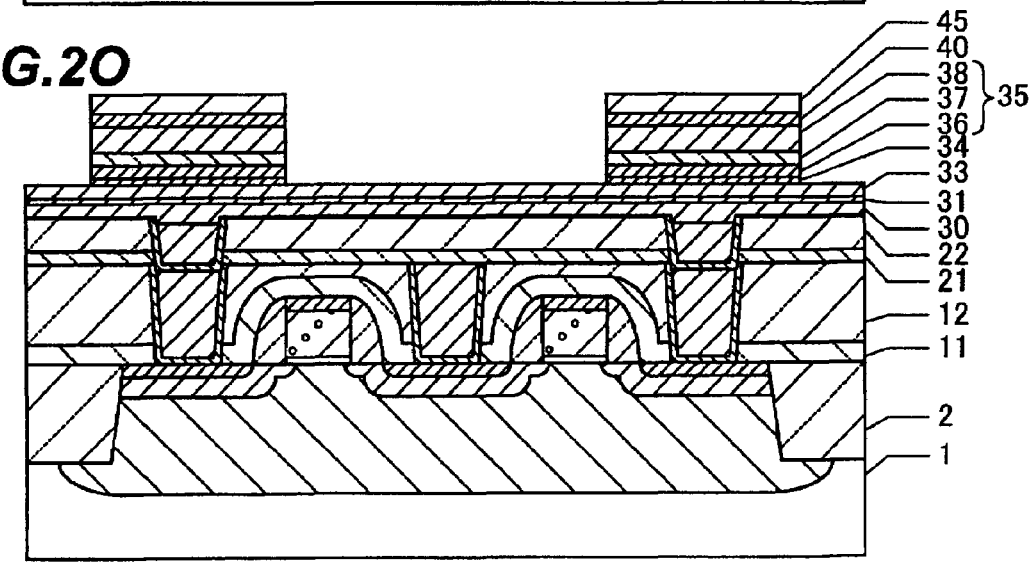

As sown in FIG. 2O, the second hard mask 46 is removed by dry etching or wet etching. The first hard mask 45 is therefore exposed.

Figure 2P:
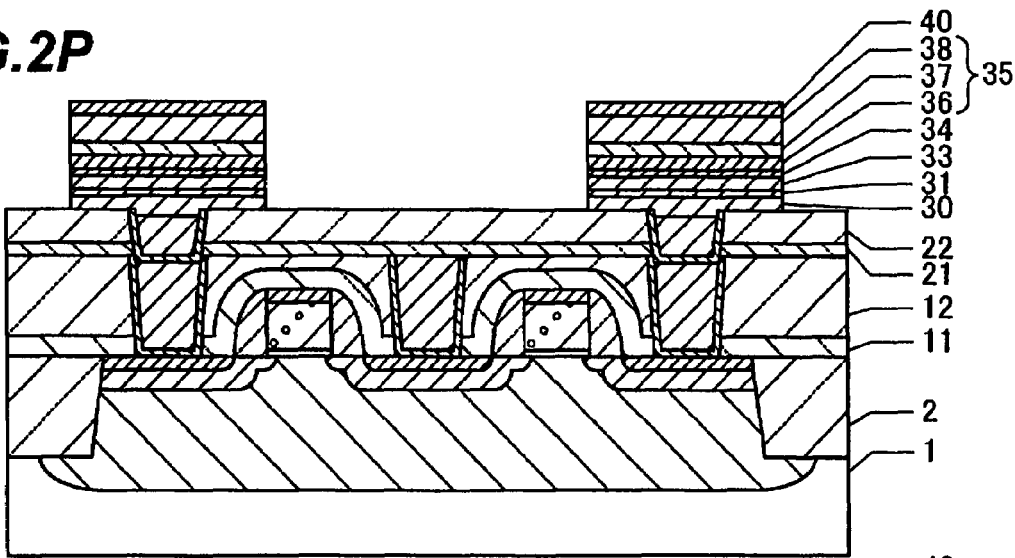

As shown in FIG. 2P, the oxygen barrier film 33, crystallinity improving film 31 and base conductive film 30 in the area where the ferroelectric capacitor 35 is not disposed are etched by using Ar ions. At this time, the first hard mask 45 left on the hydrogen barrier film 40 is removed and the hydrogen barrier film 40 is exposed.

If the intermediate layer 34 is not disposed, i.e., if heat treatment for forming the intermediate layer 34 shown in FIG. 2H is not performed after the oxygen barrier film 36 shown in FIG. 2G is formed, the capacitor stripping phenomenon is likely to occur at this stage. In contrast, the capacitor stripping phenomenon did not occur if the intermediate layer 34 is disposed as in this embodiment.

Figure 5B:
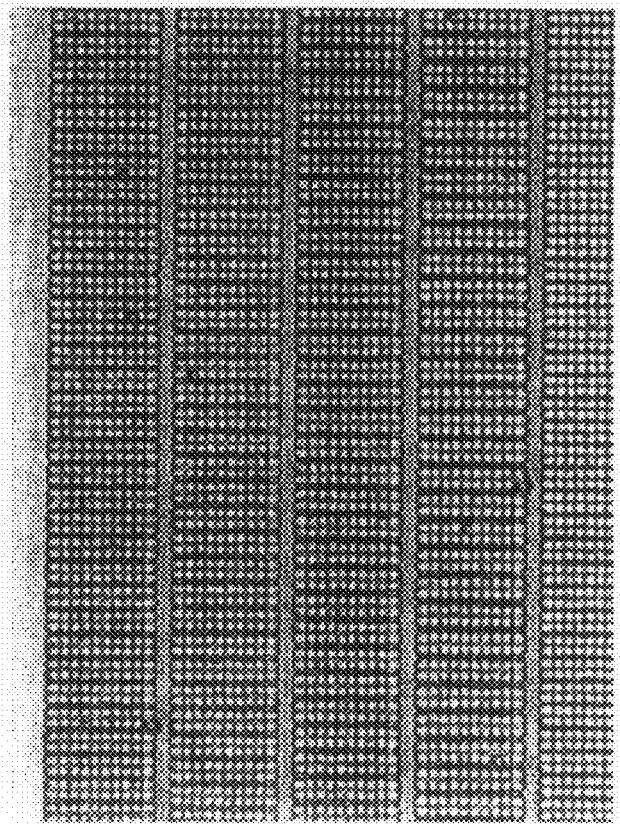
FIG. 5B is a metallurgical microscope photograph of a sample with a number of capacitors manufactured by the embodiment method.
Figure 5A:
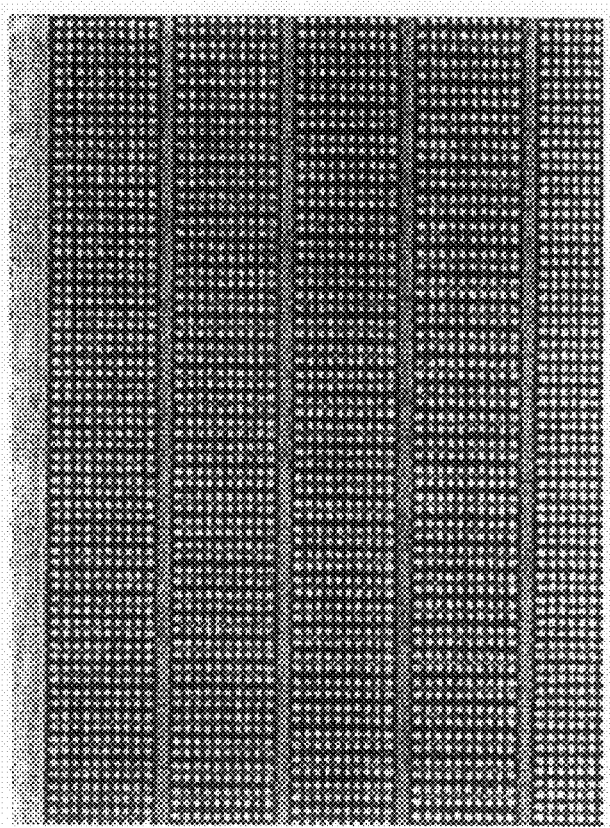
FIG. 5A is a metallurgical microscope photograph of a sample with a number of capacitors manufactured by the comparative example method.

FIG. 5A is a metallurgical microscope photograph showing the surface of a sample without the intermediate layer 34, and FIG. 5B is a metallurgical microscope photograph showing the surface of a sample manufactured by the embodiment method. Regularly disposed white points correspond to capacitors. A plan shape of each capacitor is a square having one side length of 0.5 μm. In the sample shown in FIG. 5A, it can be seen that some points corresponding to capacitors are black. It has been found from observation of the cross section that the capacitor stripping phenomenon occurred at the black point. In contrast, in the sample shown in FIG. 5B manufactured by the embodiment method, no capacitor stripping phenomenon occurred. By disposing the intermediate layer 34 between the oxygen barrier film 33 and lower electrode 36, the capacitor stripping phenomenon can be prevented.

Figure 2Q:
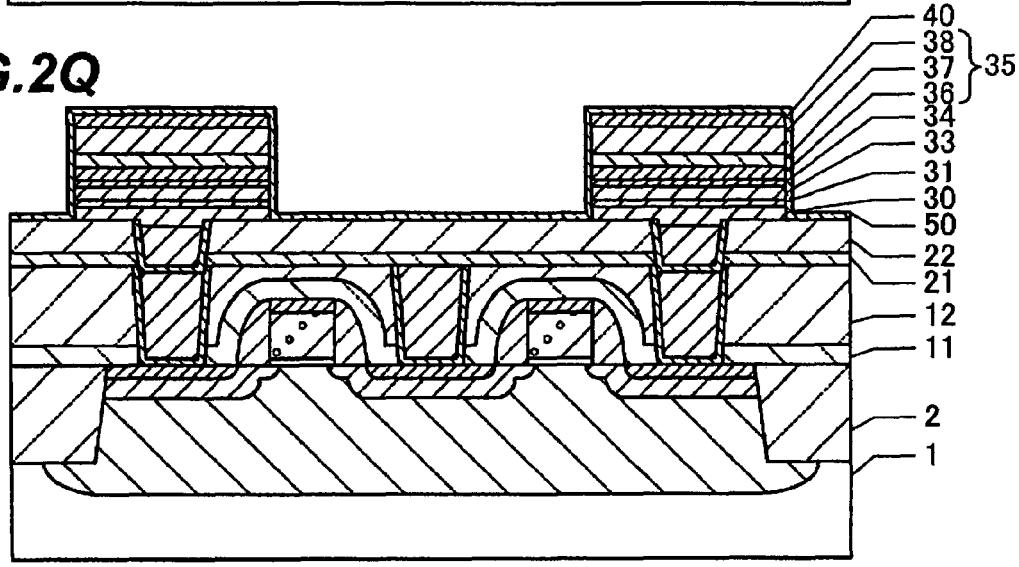

As shown in FIG. 2Q, a first protective film 50 of $Al_2O_3$ having a thickness of 20 nm is formed on the exposed surface by sputtering.

Figure 2R:
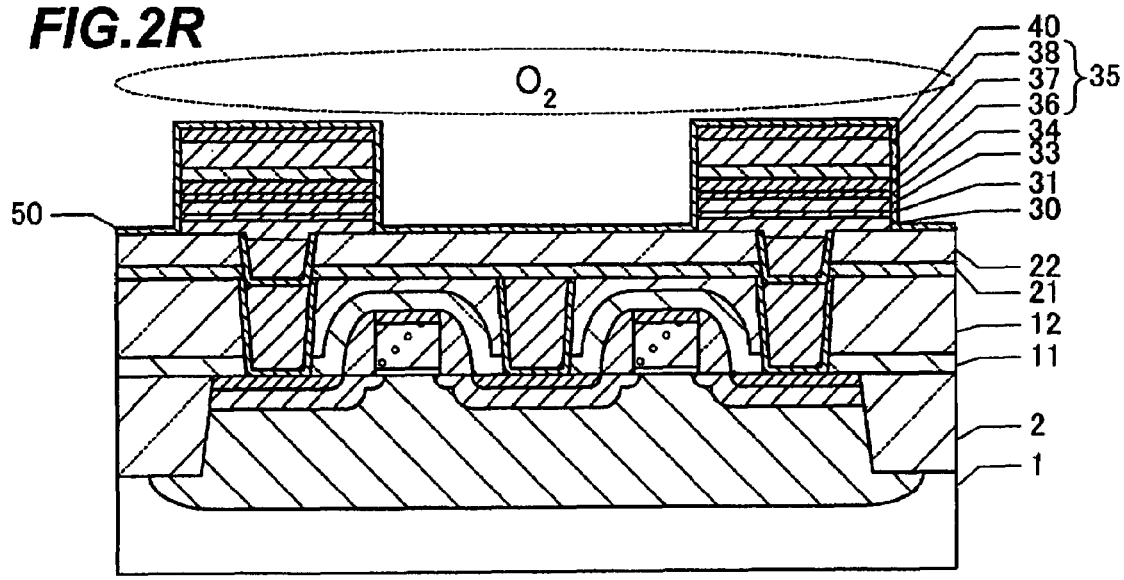

As shown in FIG. 2R, recovery annealing is performed in an oxygen atmosphere at a temperature range between 550° C. and 700° C. Damages of the dielectric film 37 can therefore be recovered. For example, if the dielectric film 37 is made of PZT, it is preferable to perform recovery annealing for 60 minutes at a temperature of 650° C. Instead of the oxygen atmosphere, an oxygen-containing oxidizing atmosphere may be used for the recovery annealing.

Figure 2S:
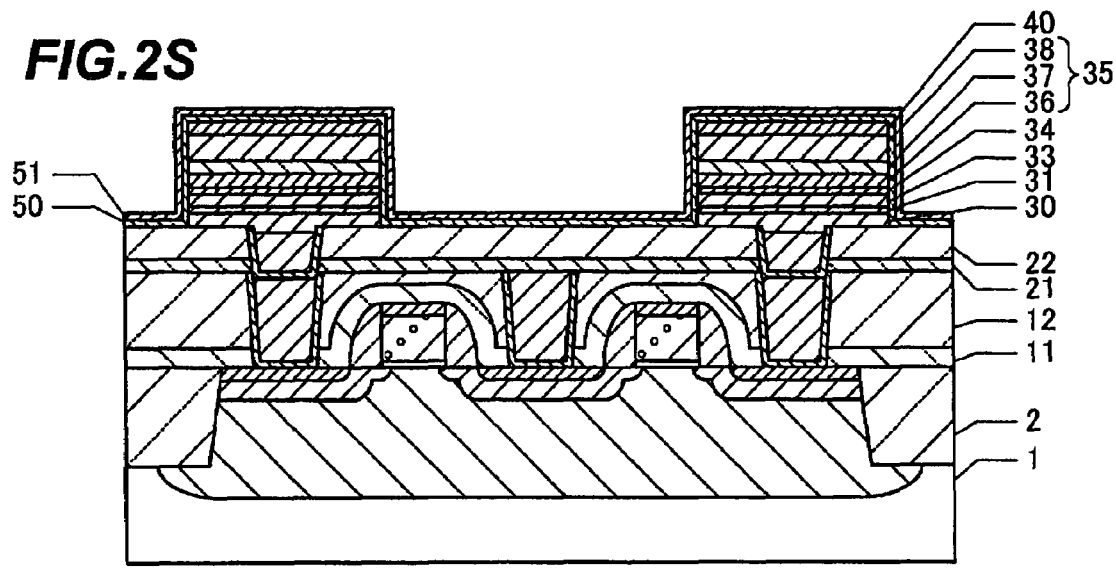

As shown in FIG. 2S, a second protective film 51 of $Al_2O_3$ having a thickness of 20 nm is formed on the first protective film 50 by CVD.

Figure 2T:
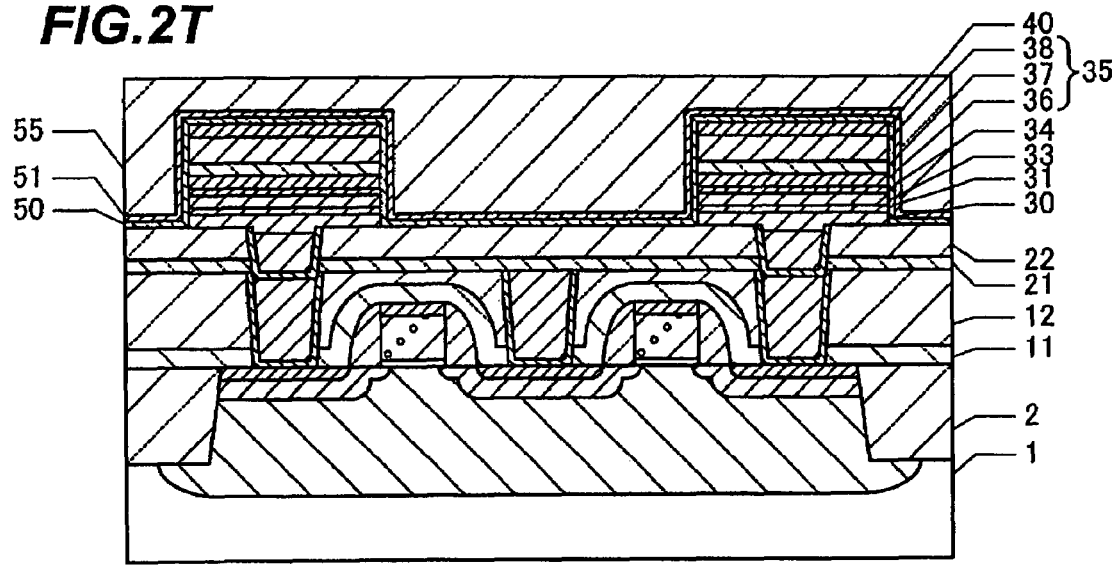

As shown in FIG. 2T, an interlayer insulating film 55 of $SiO_2$ having a thickness of 1500 nm is formed on the second protective film 51 by plasma CVD using $O_2$, TEOS and He. After the interlayer insulating film 55 is formed, the surface thereof is planarized by CMP. Instead of $SiO_2$, the interlayer insulating film 55 may be made of inorganic insulating material or the like.

Figure 2U:
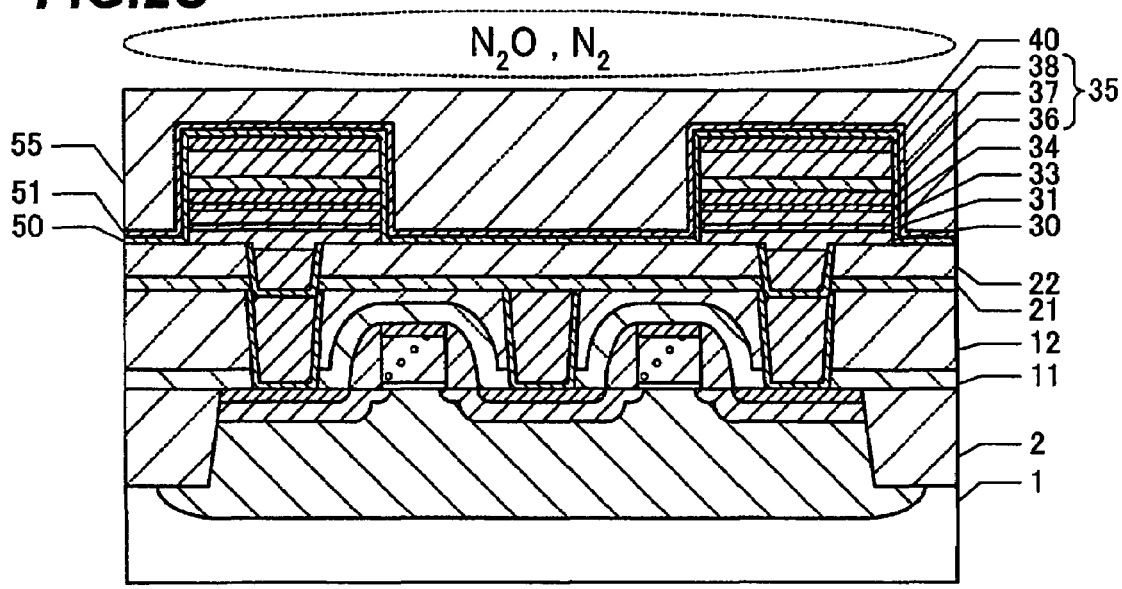

As shown in FIG. 2U, heat treatment is performed in a plasma atmosphere of $N_2O$ gas or $N_2$ gas. With this heat treatment, moisture in the interlayer insulating film 55 is removed and the film quality of the interlayer insulating film 55 changes so that the interlayer insulating film 55 becomes hard to be impregnated with moisture.

Figure 2V:
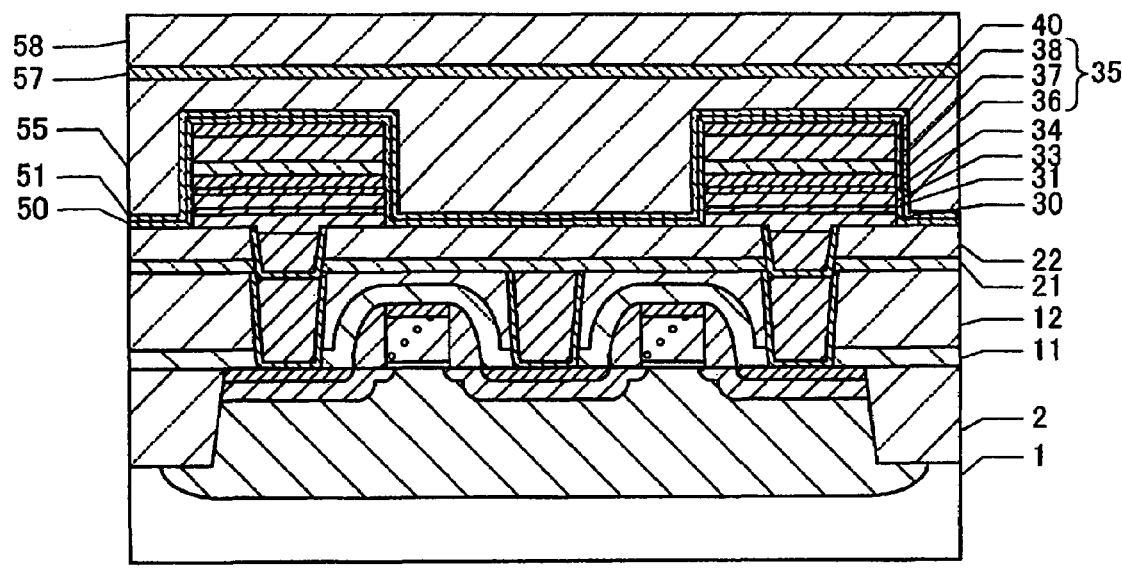

As shown in FIG. 2V, a barrier film 57 of AlO having a thickness of 20 nm to 100 nm is formed on the interlayer insulating film 55 by sputtering or CVD. Since the underlying surface of the barrier film 57 is planarized, more stable barrier performance can be retained more than the barrier film is formed on an irregular surface.

An interlayer insulating film 58 of $SiO_2$ having a thickness of 300 nm to 500 nm is formed on the barrier film 57 by plasma CVD using $O_2$, TEOS and He. Instead of $SiO_2$, the interlayer insulating film 58 may be made of SiON or SiN.

Figure 2W:
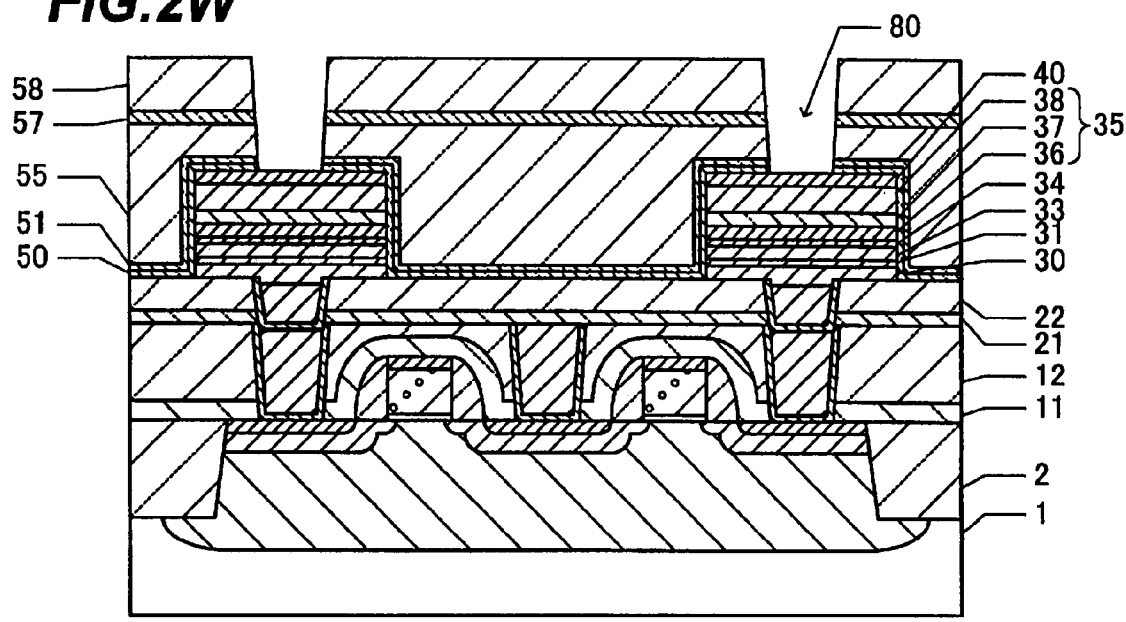

As shown in FIG. 2W, via holes 80 are formed through five layers between the interlayer insulating film 58 and the first protective film 50, reaching the hydrogen barrier film 40 on the ferroelectric capacitor 35.

Figure 2X:
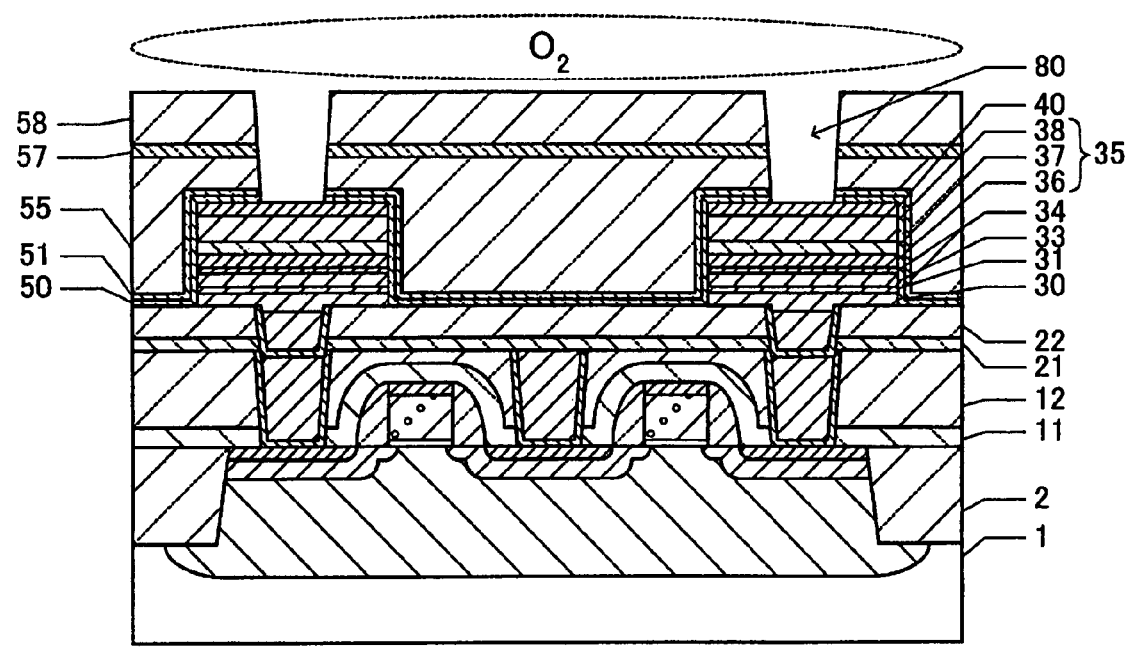

As shown in FIG. 2X, heat treatment is performed in an oxygen atmosphere at 550° C. It is therefore possible to recover oxygen loss in the dielectric film 37 formed while the via hole 80 is formed.

Figure 2Y:
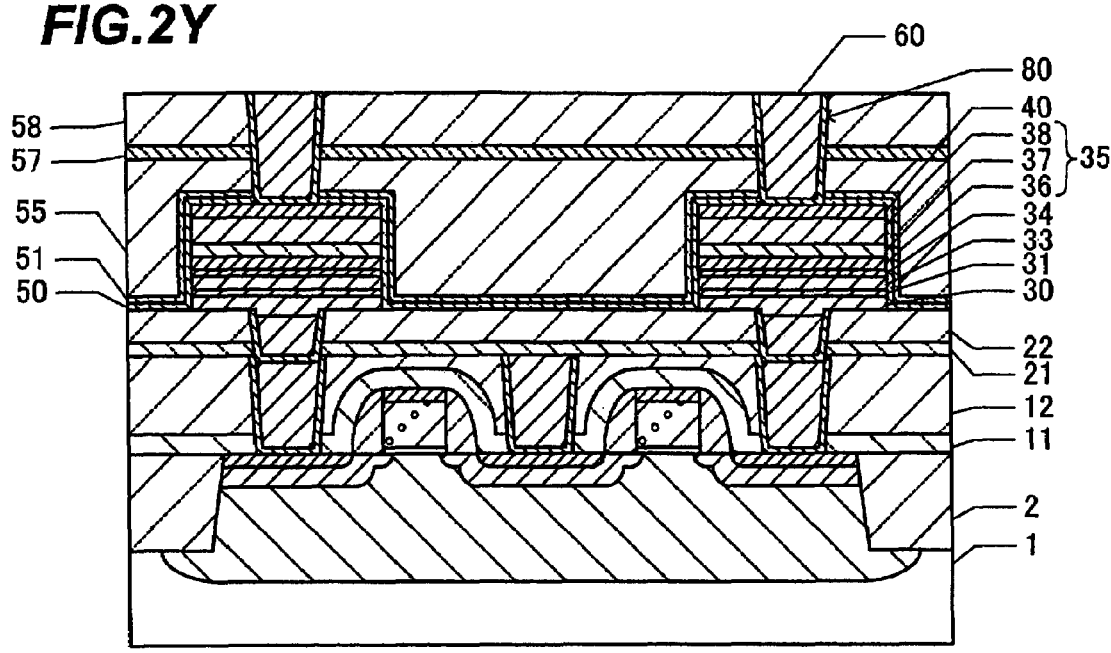

As shown in FIG. 2Y, the inner surface of the via hole 80 is covered with a glue film of TiN or the like, and the via hole 80 is filled with a conductive plug 60 of W or the like. The glue film may have a two-layer structure of a Ti film formed by sputtering and a TiN film formed by MOCVD. After the TiN film is formed, a plasma process is performed using mixture gas of $N_2$ gas and $H_2$ gas in order to remove carbon from the TiN film. In this case, since the hydrogen barrier film 40 prevents impregnation of hydrogen, it is possible to prevent the upper electrode 38 from being reduced. Further, since the IrO composition ratio of the upper layer portion of the upper electrode 38 is set near to a stoichiometric composition ratio, the upper electrode 38 is hard to serve as a catalyst to hydrogen. It is therefore difficult that the dielectric film 37 is reduced by hydrogen radical.

Figure 2Z:
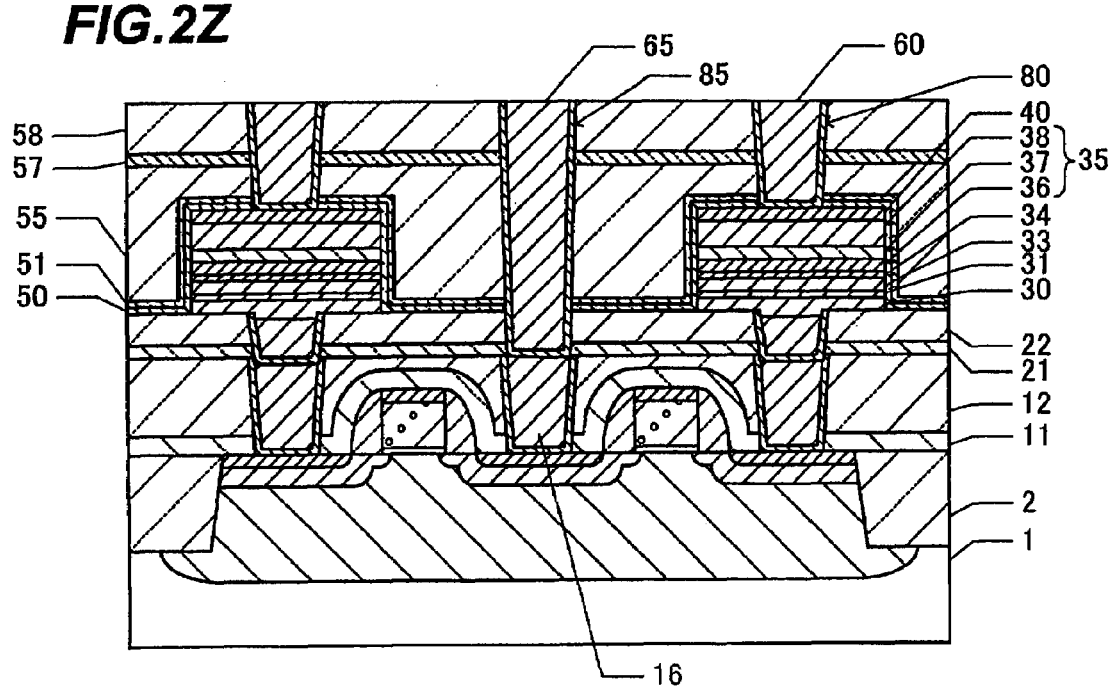

As shown in FIG. 2Z, a via hole 85 is formed through seven layers between the interlayer insulating film 58 and the oxidation preventive film 21, reaching the upper surface of the conductive plug 16. A glue film of TiN or the like covering the inner surface of the via hole 85 is formed, and the via hole 85 is filled with a conductive plug 65 of W or the like.

As shown in FIG. 1A, the wirings 71 and 75 are formed on the interlayer insulating film 58. Brief description will be made hereunder on a method of forming the wirings 71 and 75.

First, a Ti film having a thickness of 60 nm, a TiN film having a thickness of 30 nm, an AlCu alloy film having a thickness of 360 nm, a Ti film having a thickness of 5 nm and a TiN film having a thickness of 70 nm are sequentially formed by sputtering. A lamination structure constituted of these films is patterned to form the wirings 71 and 75. An upper level multi-layer wiring structure is further formed over the wirings 71 and 75.

Next, with reference to FIGS. 3A to 4D, description will be made on the advantageous effects of the heat treatment performed for forming the intermediate film 34 in the process shown in FIG. 2H after the oxygen barrier film 36 shown in FIG. 2G is formed.

In order to confirm the effects of the heat treatment, Samples A, B and C of three types were manufactured. For Sample A, after the oxygen barrier film 36 was formed, the PZT film was formed on the oxygen barrier film 36 without performing heat treatment. For Sample B, after the oxygen barrier film 36 was formed, heat treatment was performed in an Ar atmosphere for 60 seconds at 750° C. before the PZT film is formed. For Sample C, after the oxygen barrier film 36 was formed, heat treatment was performed in an Ar atmosphere for 60 seconds at 650° C. before the PZT film is formed.

Figure 3A:
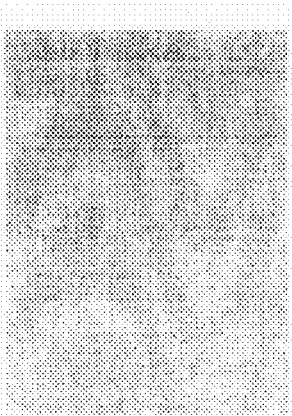
FIGS. 3A to 3D are metallurgical microscope photographs of a PZT film surface of Sample A manufactured by a comparative example method.
Figure 3B:
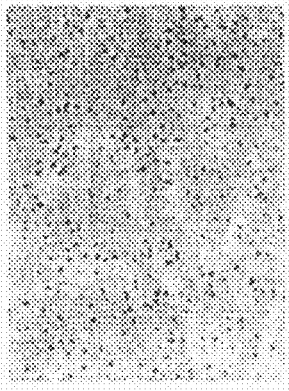
Figure 3C:
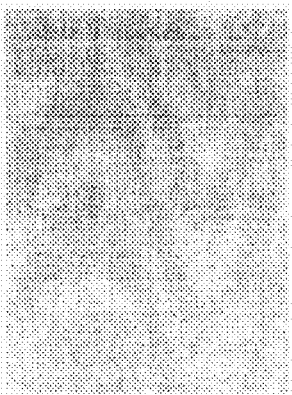
Figure 3D:
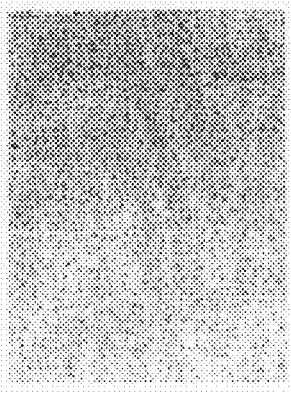
Figure 3E:
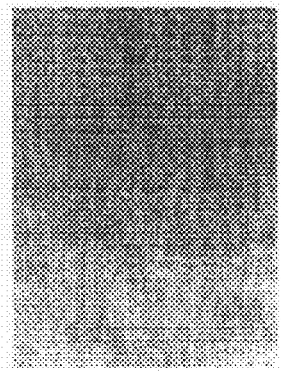
FIGS. 3E to 3H are metallurgical microscope photographs of a PZT film surface of Sample B manufactured by an embodiment method.
Figure 3F:
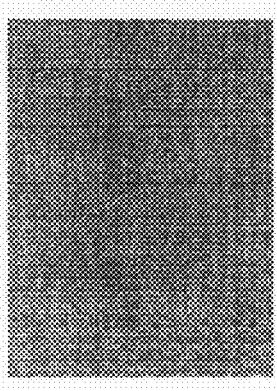
Figure 3G:
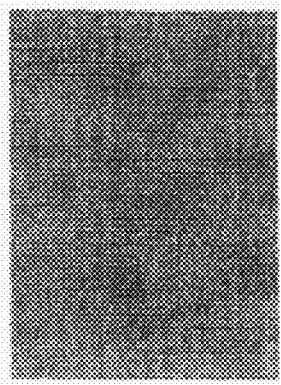
Figure 3H:
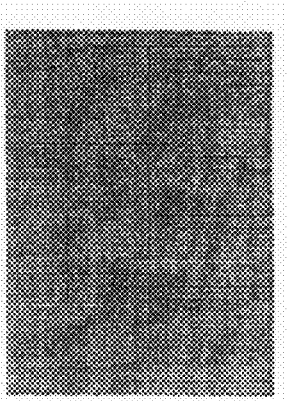
Figure 3I:
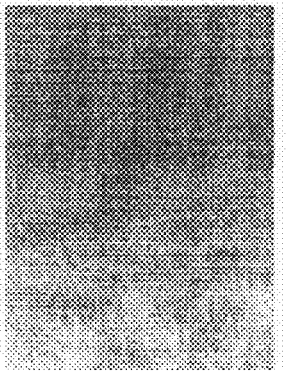
FIGS. 3I to 3L are metallurgical microscope photographs of a PZT film surface of Sample C manufactured by the embodiment method.
Figure 3J:
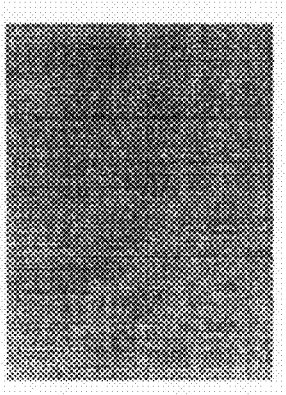
Figure 3K:
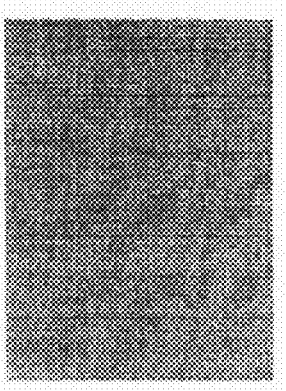
Figure 3L:
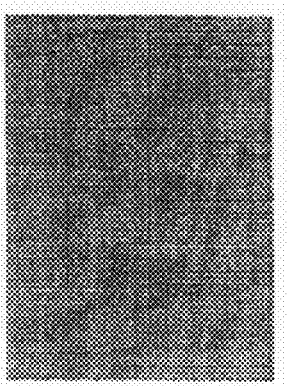

FIGS. 3A to 3D are metallurgical microscope photographs of a surface of Sample A, FIGS. 3E to 3H are metallurgical microscope photographs of a surface of Sample B, and FIGS. 3I to 3L are metallurgical microscope photographs of a surface of Sample C. These photographs were observed at a magnification factor of 1000. FIGS. 3A, 3E and 3I are metallurgical microscope photographs of the surfaces in a central area of wafers, and the other figures are metallurgical microscope photographs of the surfaces in an area near wafer edges. In Sample A without the heat treatment, the surface of the PZT film is rough and clouded. In contrast, in Samples B and C with the heat treatment, the surfaces are not clouded.

For Sample A, a temperature when the lower electrode layer 36 is formed is relatively low so that crystalline grains are small just after the lower electrode 36 is formed. Since a temperature becomes higher when the PZT film is formed, crystalline gains of the lower electrode layer 36 grow and become large. Therefore, the surface of the PZT film formed on the lower electrode layer 36 becomes rough and clouded. There is a tendency that a temperature of a wafer peripheral area becomes relatively low while the lower electrode layer 36 is formed. As a result, while the PZT film is formed, growth of crystalline grains is likely to occur and the white turbidity is conspicuous in the wafer peripheral area.

For Samples B and C, after the lower electrode layer 36 is formed, heat treatment is performed at a temperature higher than that at which the PZT film is formed. With this heat treatment, crystalline grains of the lower electrode layer 36 are made uniform, and growth of crystalline grains will not occur while the PZT film is formed. Therefore, the surface of the PZT film does not become clouded. In order to prevent a white turbidity of the PZT film, it is preferable to set a heat treatment temperature at which the intermediate film 34 shown in FIG. 2H is formed, higher than a temperature at which the dielectric film 37 shown in FIG. 2I is formed.

Figure 4A:
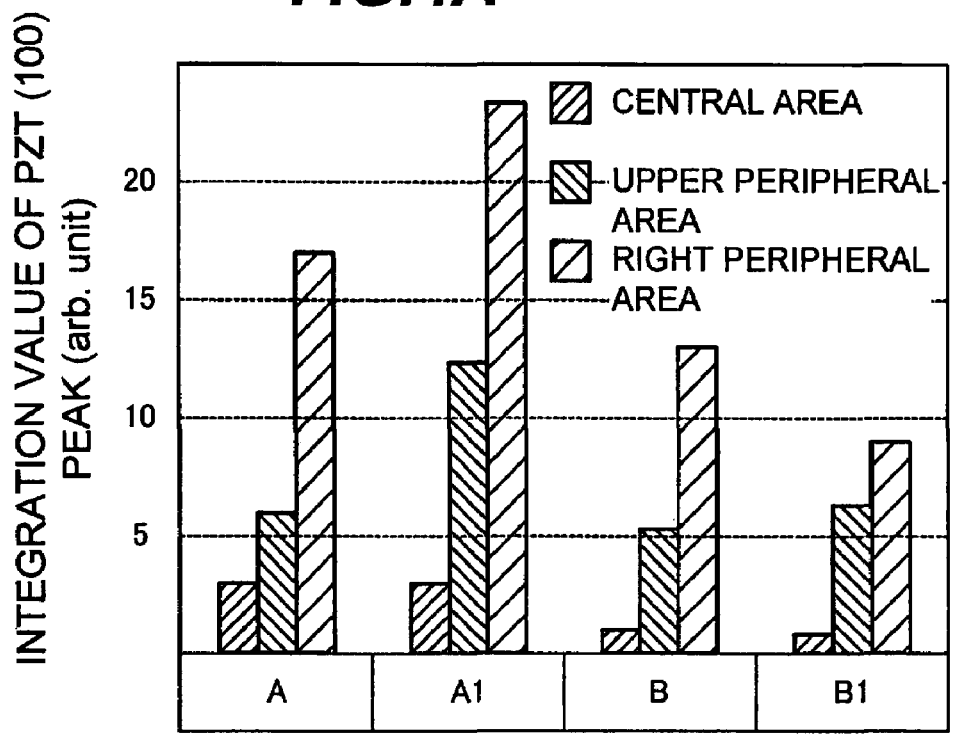
FIG. 4A is a graph showing integration values of (100) peaks of PZT films of Samples A, A1, B and B1.
Figure 4B:
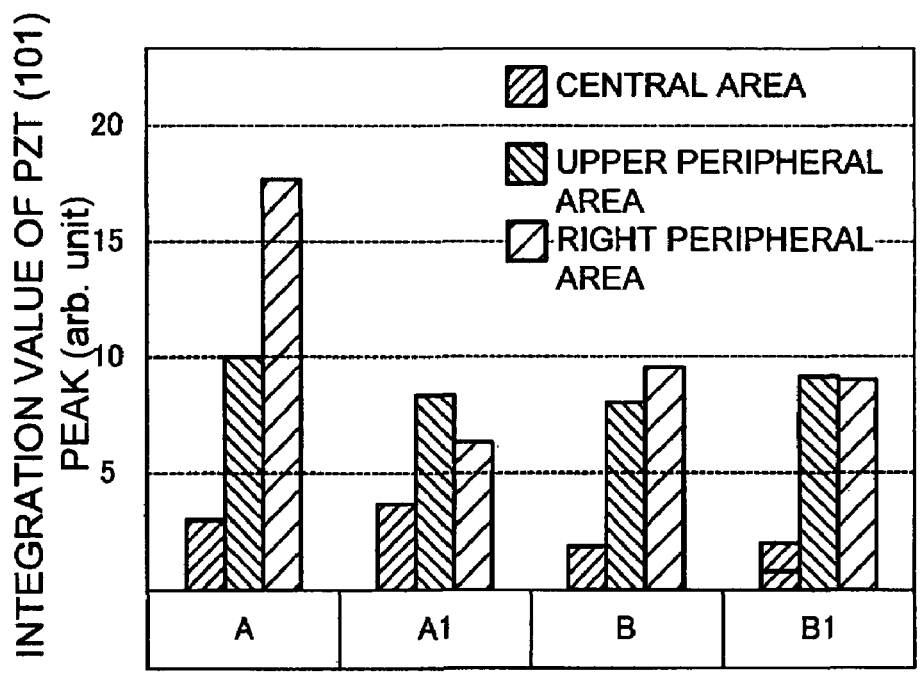
FIG. 4B is a graph showing integration values of (101) peaks of PZT films of Samples A, A1, B and B1.
Figure 4C:
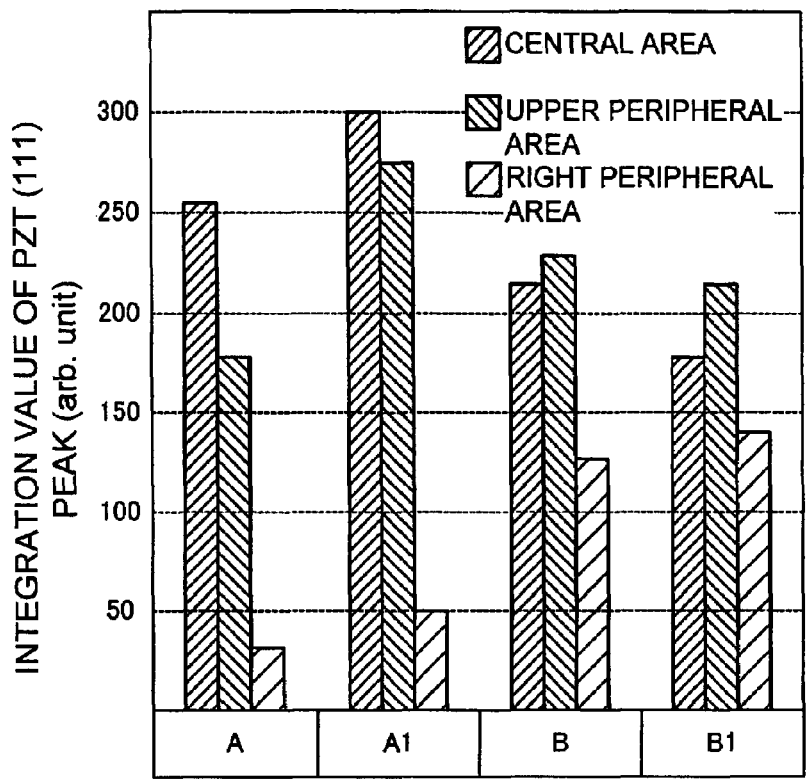
FIG. 4C is a graph showing integration values of (111) peaks of PZT films of Samples A, A1, B and B1.

FIGS. 4A to 4C show integration values (areas) of peaks of x-ray diffraction patterns of PZT films of Samples A, A1, B and B1. FIGS. 4A, 4B and 4C show integration values of (100) peaks, (101) peaks and (111) peaks, respectively. Sample A1 was manufactured under the same conditions as those for Sample A, and Sample B1 was manufactured under the same conditions as those for Sample B. Of three bar graphs of each Sample, a left bar graph, a central bar graph and a right bar graph indicate the measurement results of a wafer central area, a wafer upper peripheral area and a wafer right peripheral area, respectively.

Figure 4D:
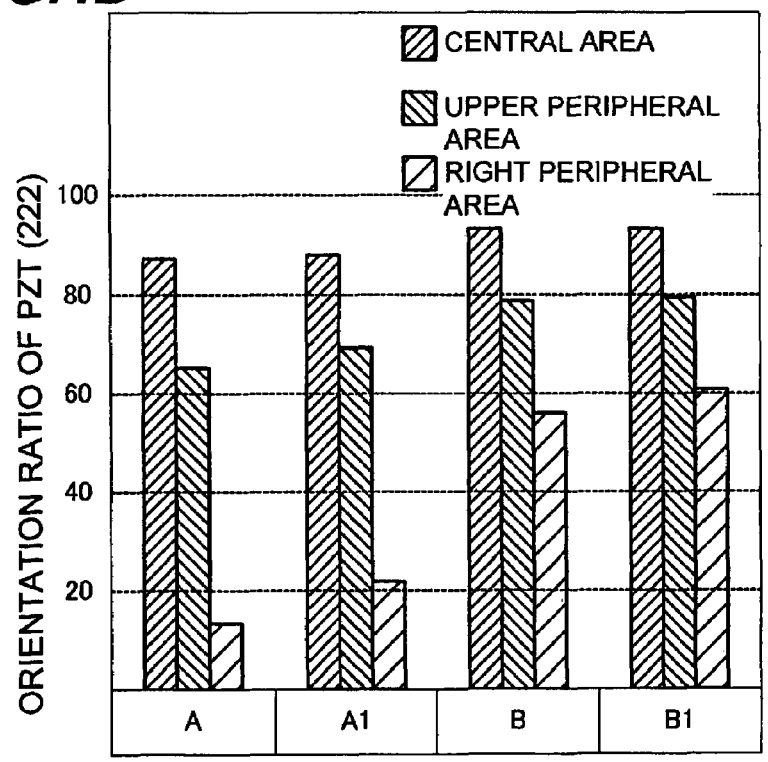
FIG. 4D is a graph showing (222) orientation ratios of PZT films of Samples A, A1, B and B1.

FIG. 4D indicates orientation ratios of (222) plane of the PZT film of each Sample. The orientation ratio of (222) plane is defined by I(222)/[I(100)+I(101)+I(222)] where I(222), I(100) and I(101) represent integration values of (222) peaks, (100) peaks and (101) peaks, respectively.

As compared to Samples A and A1 without heat treatment prior to forming the lower electrode layer, Samples B and B1 with the heat treatment have a suppressed (100) orientation and a strong (111) orientation. Therefore, an orientation ratio of (222) plane is improved. Particularly in the wafer peripheral area, improvement of the orientation ratio of (222) plane is considerable.

As in the above-described embodiment, it is possible to prevent occurrence of the capacitor stripping phenomenon by forming the intermediate layer 34 by performing heat treatment after the lower electrode layer 36 is formed and before the ferroelectric film is formed. Further, crystallinity and orientation of the ferroelectric film can be improved by performing heat treatment at a temperature higher than that at which the ferroelectric film is formed. In this manner, the switching characteristics of the ferroelectric capacitor 35 can be suppressed from being degraded.

Next, with reference to FIGS. 6A and 6B, description will be made on a semiconductor device and its manufacture method according to the second embodiment. The following description will be made by paying attention to different points from the first embodiment method, and description is omitted for the same processes and structures.

Figure 6A:
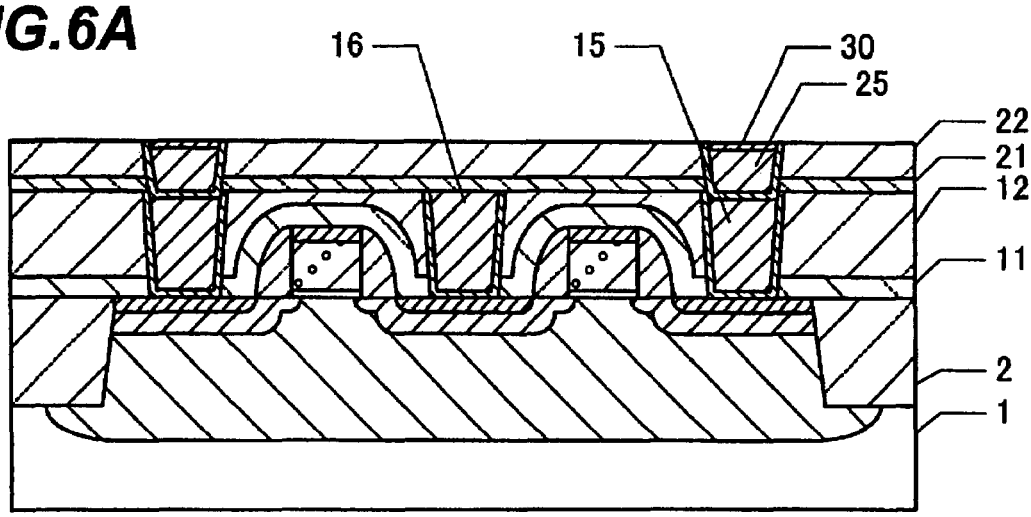
FIG. 6A is a cross sectional view of a semiconductor device during manufacture according to a second embodiment.

FIG. 6A corresponds to the stage shown in FIG. 2D in the first embodiment. In the first embodiment, as shown in FIG. 2D, CMP is stopped in the state that the base conductive film 30 is left on the interlayer insulating film 22. However, in the second embodiment, CMP continues until the surface of the interlayer insulating film 22 is exposed. Therefore, in the second embodiment, the base conductive film 30 is left only in the recess formed at the position of the conductive plug 25. Since the upper surface of the interlayer insulating film 22 and the upper surface of the base conductive film 30 have the same level, the surface is planarized. Succeeding processes are the same as those of the first embodiment.

Figure 6B:
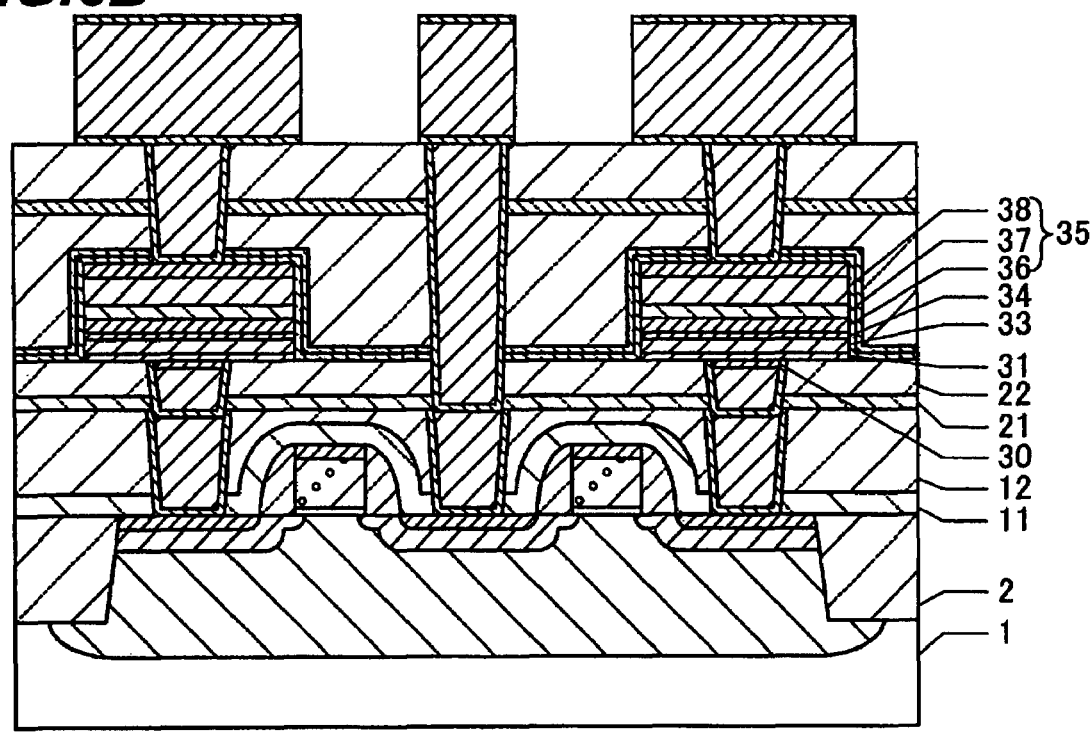
FIG. 6B is a cross sectional view of the semiconductor device of the second embodiment.

FIG. 6B is a cross sectional view of the semiconductor device of the second embodiment. The base conductive film 30 is disposed only on the conductive plug 25, and the crystallinity improving film 31 is disposed on the base conductive film 30 and the interlayer insulating film 22 closing around the base conductive film 30.

Also in the second embodiment, the intermediate film 34 is disposed between the oxidation preventive film 33 and lower electrode 36. Therefore, as in the case of the first embodiment, the capacitor stripping phenomenon can be prevented, and orientation and crystallinity of the dielectric film 37 can be improved.

In the above-described embodiments, although the dielectric film 37 of the ferroelectric capacitor 35 is formed by MOCVD and sputtering, the dielectric film may be formed by other methods. For example, the dielectric film may be formed by a sol-gel method, a metal organic deposition (MOD) method, a chemical solution deposition (CSD) method, a chemical vapor deposition (CVD) method, an epitaxial growth method or the like.

The present invention has been described in connection with the preferred embodiments. The invention is not limited only to the above embodiments. It will be apparent to those skilled in the art that other various modifications, improvements, combinations, and the like can be made.

What is claimed is:

1. A method of manufacturing a semiconductor device comprising steps of:
    (a) forming an interlayer insulating film over a semiconductor substrate;
    (b) forming a via hole through the interlayer insulating film and filling the via hole with a conductive plug;
    (c) forming an oxygen barrier film over an upper surface of the conductive plug and over an upper surface of the interlayer insulating film;
    (d) depositing a lower electrode layer on the oxygen barrier film;
    (e) executing heat treatment to form an intermediate film at an interface between the oxygen barrier film and the lower electrode layer, the intermediate film being made of alloy which contains at least one constituent element of the oxygen barrier film and at least one constituent element of the lower electrode layer;
    (f) sequentially forming a dielectric layer and an upper electrode layer on the lower electrode layer; and
    (g) patterning each of layers between the oxygen barrier film and the upper electrode layer to leave the oxygen barrier film in an area where the conductive plug is disposed.

2. The method of manufacturing the semiconductor device according to claim 1, wherein the heat treatment in the step (e) is performed at a temperature higher than a substrate temperature at which the dielectric layer is formed.

3. The method of manufacturing the semiconductor device according to claim 1, wherein the heat treatment in the step (e) is performed in an inert gas atmosphere.

4. The method of manufacturing the semiconductor device according to claim 3, wherein the inert gas is Ar, $N_2$ or He.

5. The method of manufacturing the semiconductor device according to claim 1, further comprising, between the steps (b) and (c), steps of:
    (b1) exposing the upper surface of the conductive plug and the upper surface of the interlayer insulating film to plasma which contains gas of $NH_3$, $N_2O$ or $N_2$;
    (b2) depositing a base conductive film on a surface exposed to the plasma; and
    (b3) planarizing a surface of the base conductive film,
    wherein in the step (c) the oxygen barrier film is formed on the planarized base conductive film.

6. The method of manufacturing the semiconductor device according to claim 5, further comprising, between the steps (b3) and (c), a step of exposing the planarized surface of the base conductive film to the plasma which contains gas of $NH_3$, $N_2O$ or $N_2$.

* * * * *